(12) United States Patent
Yoshida

(10) Patent No.: US 10,866,471 B2
(45) Date of Patent: Dec. 15, 2020

(54) DRIVE CIRCUIT, MATRIX SUBSTRATE, AND DISPLAY DEVICE

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/481,493

(22) PCT Filed: Feb. 16, 2018

(86) PCT No.: PCT/JP2018/005566
§ 371 (c)(1),
(2) Date: Jul. 29, 2019

(87) PCT Pub. No.: WO2018/155346
PCT Pub. Date: Aug. 30, 2018

(65) Prior Publication Data
US 2019/0391436 A1    Dec. 26, 2019

(30) Foreign Application Priority Data

Feb. 23, 2017 (JP) ................................. 2017-032661

(51) Int. Cl.
*G02F 1/1345* (2006.01)
*G02F 1/1362* (2006.01)
(Continued)

(52) U.S. Cl.
CPC ........ *G02F 1/13454* (2013.01); *G02F 1/1339* (2013.01); *G02F 1/1368* (2013.01);
(Continued)

(58) Field of Classification Search
CPC ... G09G 3/3674; G09G 3/3677; G09G 3/3266
See application file for complete search history.

(56) References Cited

U.S. PATENT DOCUMENTS 6,191,832 B1    2/2001   Nakakura
9,153,341 B2 *  10/2015  Umezaki .............. G09G 3/3677
(Continued)

FOREIGN PATENT DOCUMENTS

| JP | 10-39333 A    | 2/1998 |
| JP | 2000-56319 A  | 2/2000 |

(Continued)

OTHER PUBLICATIONS

Official Communication issued in International Patent Application No. PCT/JP2018/005566, dated Apr. 24, 2018.

*Primary Examiner* — Sepehr Azari
(74) *Attorney, Agent, or Firm* — Keating & Bennett, LLP

(57) ABSTRACT

A drive circuit that has a high production yield is achieved. A unit circuit (50) of a scanning line drive circuit (47) includes a branch wire (61 to 65) and a redundant wire (51 to 55). The branch wire (61 to 65) is formed by a source layer and includes a plurality of connection portions (72). The redundant wire (51 to 55) corresponds to the branch wire (61 to 65), is formed by a redundant wire layer, and includes a plurality of connection portions (57) that allow connection to the connection portions (72) of the branch wire (61 to 65).

14 Claims, 17 Drawing Sheets

(51) Int. Cl.
  *G09G 3/36* (2006.01)
  *G02F 1/1339* (2006.01)
  *G02F 1/1368* (2006.01)
  *H01L 27/12* (2006.01)

(52) U.S. Cl.
  CPC ..... *G02F 1/136286* (2013.01); *G09G 3/3648* (2013.01); *G09G 3/3677* (2013.01); *H01L 27/124* (2013.01); *G09G 2300/0426* (2013.01); *G09G 2300/08* (2013.01)

(56) References Cited

U.S. PATENT DOCUMENTS

| | | | |
|---|---|---|---|
| 2001/0050799 A1 | 12/2001 | Murade | |
| 2003/0189542 A1* | 10/2003 | Lee | G09G 3/3677 345/93 |
| 2008/0079685 A1* | 4/2008 | Umezaki | G11C 19/28 345/100 |
| 2008/0106541 A1* | 5/2008 | Yamazaki | G09G 3/3655 345/212 |
| 2010/0182226 A1* | 7/2010 | Umezaki | G09G 3/3677 345/98 |
| 2012/0162179 A1* | 6/2012 | Tanaka | G09G 3/3677 345/211 |
| 2012/0168762 A1* | 7/2012 | Kikuchi | H01L 27/3276 257/59 |
| 2013/0147779 A1* | 6/2013 | Ochiai | G02F 1/1345 345/211 |
| 2013/0153941 A1* | 6/2013 | Sasaki | H01L 33/08 257/88 |
| 2015/0070616 A1* | 3/2015 | Ogasawara | G02F 1/1368 349/43 |

FOREIGN PATENT DOCUMENTS

| | | |
|---|---|---|
| JP | 2002-40962 A | 2/2002 |
| JP | 2010-134078 A | 6/2010 |
| WO | 2011/030590 A1 | 3/2011 |

\* cited by examiner

DRIVE CIRCUIT, MATRIX SUBSTRATE, AND DISPLAY DEVICE

TECHNICAL FIELD

The present invention relates to a drive circuit, and particularly relates to a matrix substrate in which a drive circuit is monolithically formed and a display device using the matrix substrate.

BACKGROUND ART

In small-to-medium-sized display devices, a Gate Driver Monolithic (GDM) technique of monolithically forming a scanning line drive circuit (gate driver) in a matrix substrate has been recently adopted for cost reduction. For example, PTLs 1 to 3 disclose a display device using an active matrix substrate that includes (i) a display region where pixel transistors are arranged and (ii) a peripheral region where a scanning line drive circuit and a source drive circuit that drive the pixel transistors are arranged.

Further, the small-to-medium-sized display devices also have more enhanced definition. Thus, a vertical width (a width in a direction in which a data signal line extends) of a unit circuit that forms the scanning line drive circuit becomes narrower with a pixel pitch. Furthermore, as a frame size is further reduced, it is also difficult to enlarge a horizontal width (a width in a direction in which a scanning line extends) of a region where the scanning line drive circuit is formed. Thus, the scanning line drive circuit is required to have a smaller area. In order to reduce an area of the unit circuit that forms the scanning line drive circuit, PTL 1 discloses a configuration in which a branch wire through which a transistor and a trunk wire that are included in the unit circuit are connected does not need to circumvent the transistor which is not connected. Further, PTL 2 discloses a configuration in which three wires of the unit circuit are able to be overlapped with each other in the same region.

As the definition is enhanced, thinning of a drawn wire from the scanning line drive circuit is also proceeding. Thus, mechanical strength of the drawn wire is lowered and the drawn wire is easily broken. PTL 3 discloses a configuration in which stress concentration on a drawn wire is prevented to prevent the drawn wire from being broken.

CITATION LIST

Patent Literature

PTL 1: Domestic Re-publication of PCT International Publication for Patent Application No. WO2011-030590 (internationally published on Mar. 17, 2011)
PTL 2: Japanese Unexamined Patent Application Publication No. 2002-40962 (published on Feb. 8, 2002)
PTL 3: Japanese Unexamined Patent Application Publication No. 2000-56319 (published on Feb. 25, 2000)

SUMMARY OF INVENTION

Technical Problem

However, the scanning line drive circuit as described above has a problem that a production yield of the scanning line drive circuit is low. This is because, as the vertical width of the unit circuit becomes narrow, the branch wire included in the unit circuit also becomes thin and the branch wire is easily disconnected.

The invention is made in view of the aforementioned problem and an object thereof is to achieve a drive circuit whose production yield is high.

Solution to Problem

In order to solve the aforementioned problem, a drive circuit according to an aspect of the invention includes: a plurality of unit circuits that drive a plurality of output lines and a first-type wire that connects the unit circuits and is formed by a first conductive layer, in which at least one of the unit circuits includes a plurality of circuit elements, a second-type wire that connects a circuit element included in the unit circuit to any of (i) another circuit element included in the unit circuit, (ii) the first-type wire, and (iii) a trunk wire which supplies an input, and that is formed by a second conductive layer, and a third-type wire that corresponds at least partially to at least one second-type wire and that is formed by a third conductive layer, the at least one second-type wire includes a plurality of first-type connection portions, and the third-type wire includes a plurality of second-type connection portions that allow connection to the respective first-type connection portions of a corresponding second-type wire.

Advantageous Effects of Invention

According to the aforementioned configuration of an aspect of the invention, in the at least one unit circuit, the second-type wire that has the third-type wire corresponding thereto includes a plurality of first-type connection portions and the third-type wire includes a plurality of second-type connection portions that allow connection to each of the first-type connection portions of the corresponding second-type wire. Thus, the second-type wire and the third-type wire that correspond to each other are able to be connected by connecting a first connection portion and a second connection portion. Through such connection of the second-type wire and the third-type wire, the first-type connection portions are able to be connected not only by the second-type wire but also by the third-type wire. In other words, it is possible to branch the wires.

By the branching, the drive circuit has redundancy for disconnection of the second-type wire, thus making it possible to reduce a defect of the drive circuit caused by the disconnection of the second-type wire. Accordingly, it is possible to improve a production yield of the drive circuit.

DESCRIPTION OF EMBODIMENTS

Hereinafter, embodiments of the invention will be specifically described with reference to the drawings. Note that, dimensions, materials, shapes, and relative arrangement of components described in the embodiments are merely examples and should not be considered as limiting the scope of the invention only to them.

Embodiment 1

Embodiment 1 of the invention will be described in detail below.
(Configuration of Matrix Substrate)

Figure 1:
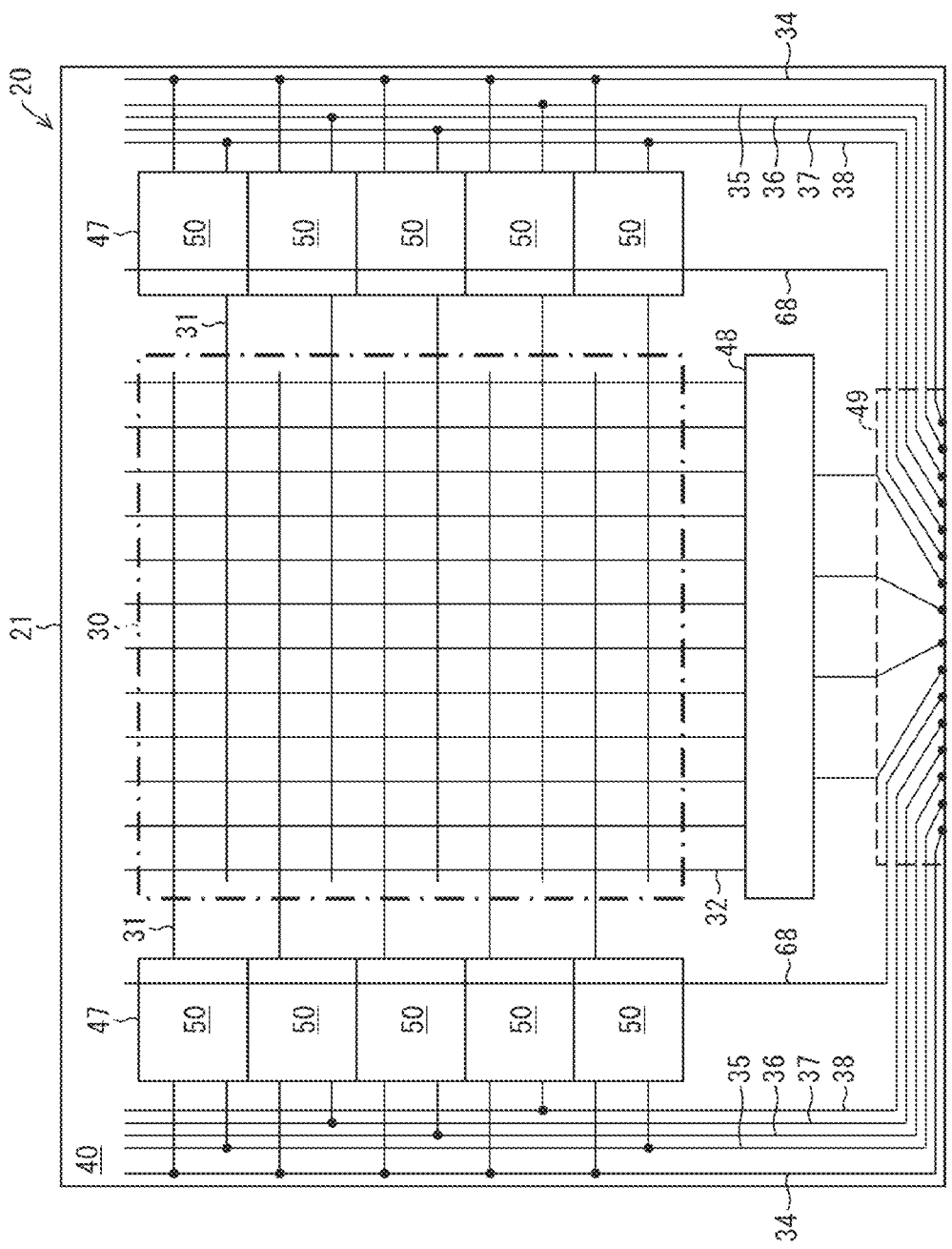
FIG. 1 is a plan view illustrating a schematic configuration of a matrix substrate including scanning line drive circuits according to an embodiment of the invention.

FIG. 1 is a plan view illustrating a schematic configuration of a matrix substrate 20 provided with scanning line drive circuits 47 according to Embodiment 1 of the invention.

As illustrated in FIG. 1, the matrix substrate 20 includes an insulating substrate 21 and the insulating substrate 21 has thereon a display region 30 and a peripheral region 40 other than the display region 30.

In the display region 30, a plurality of scanning lines 31 (output lines) and a plurality of data lines 32 are arranged in a lattice manner. Though not illustrated in FIG. 1, other structures such as a pixel transistor and a pixel electrode are also arranged in the display region 30.

In the peripheral region 40, the scanning line drive circuits 47 (drive circuits) each of which is constituted by a plurality of unit circuits 50 that drive the respective scanning lines 31, a data line drive circuit 48 that drives the respective data lines 32, a terminal portion 49 by which the matrix substrate 20 is connected to outside, wires that extend from the terminal portion 49 to the scanning line drive circuits 47, and wires that extend from the terminal portion 49 to the data line drive circuit 48 are arranged.

The data lines 32 extend in a vertical direction of FIG. 1 and are connected to the data line drive circuit 48 on a lower side. Note that, there is no limitation thereto and a configuration in which the display region 30 is divided into upper and lower parts and data line drive circuits 48 are arranged in the upper and lower parts of the display region 30 may be provided, for example.

The scanning lines 31 extend in a horizontal direction of FIG. 1 and are alternately connected one by one to the scanning line drive circuits 47 on both right and left sides. Note that, there is no limitation thereto and a configuration in which the respective scanning lines 31 are connected to the scanning line drive circuits 47 on both the right and left sides may be provided, for example. Further, for example, a configuration in which a scanning line drive circuit 47 is arranged on either right or left side may be provided.

Each of the scanning line drive circuits 47 according to Embodiment 1 has two shift registers that are combined so as to have cycles shifted. Thus, the matrix substrate 20 according to Embodiment 1 includes four shift registers and the scanning lines 31 connected to the respective shift registers are sequentially driven.

Hereinafter, a total number of scanning lines 31 is defined as N (N: natural number). Further, a unit circuit 50 that drives an nth (n: natural number equal to or less than N) scanning line 31 is defined as a unit circuit 50 on an nth stage. Furthermore, potential that the unit circuit 50 on the nth stage outputs to the nth scanning line 31 is defined as Out(n).

The wires that extend from the terminal portion 49 to the scanning line drive circuit 47 include a low-potential trunk wire 34 (trunk wire) that supplies low potential Vss, a first clock trunk wire 35 that supplies a first clock signal CK1, a second clock trunk wire 36 that supplies a second clock signal CK2, a third clock trunk wire 37 that supplies a third clock signal CK3, a fourth clock trunk wire 38 that supplies a fourth clock signal CK4, an initialization wire 68 (first-type wire) that supplies an initialization signal Reset, and a start trunk wire (not illustrated) that supplies a start signal.

Hereinafter, the first clock trunk wire 35, the second clock trunk wire 36, the third clock trunk wire 37, and the fourth clock trunk wire 38 are collectively referred to as "clock trunk wires 35 to 38". Further, the first clock signal CK1, the second clock signal CK2, the third clock signal CK3, and the fourth clock signal CK4 are collectively referred to as "clock signals CK1 to CK4".

In the present specification, a wire that passes through only an outer side of the drive circuit among wires that supply a signal, low potential, high potential, and the like to the drive circuit is referred to as a "trunk wire". Therefore, the initialization wire 68 illustrated in FIG. 1 passes through also an inner side of the scanning line drive circuit 47 and is thus not referred to as a trunk wire.
(Signal)

Figure 2:
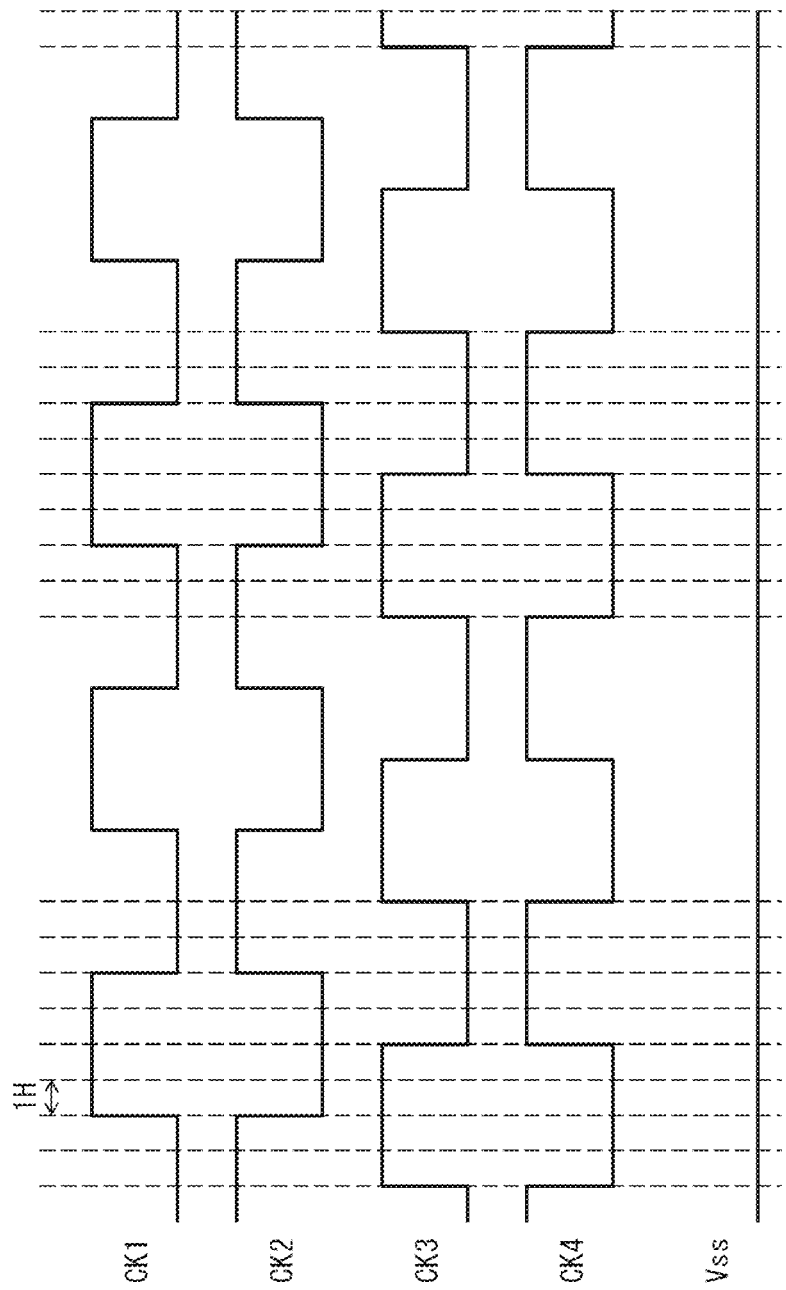
FIG. 2 is a signal view illustrating a schematic configuration of signal potential supplied by a low-potential trunk wire and clock trunk wires illustrated in FIG. 1.

FIG. 2 is a signal view illustrating a schematic configuration of signal potential supplied by the low-potential trunk wire 34 and the clock trunk wires 35 to 38 illustrated in FIG. 1.

The low potential Vss is signal potential indicating "0" and is substantially fixed potential.

The clock signals CK1 to CK4 are the same in a length of one cycle and have the signal potential Vss indicating "0" and signal potential Vdd indicating "1" inverted every half cycle. When a length of one cycle of the clock signals CK1 to CK4 is 8H, a length of H is several μ seconds (for example, 8μ seconds).

The second clock signal CK2 is a signal whose cycle is earlier than that of the first clock signal CK1 by a half cycle. The third clock signal CK3 is a signal whose cycle is earlier than that of the first clock signal CK1 by a quarter cycle. The fourth clock signal CK4 is a signal whose cycle is earlier than that of the third clock signal CK3 by a half cycle (that is, a signal whose cycle is later than that of the first clock signal by a quarter cycle).

Though not illustrated in FIG. 2, the initialization signal Reset has the signal potential Vdd indicating "1" in a case where the scanning line drive circuit 47 is initialized, and has the signal potential indicating "0" in the other cases.

(Circuit Configuration of Unit Circuit)

Figure 3:
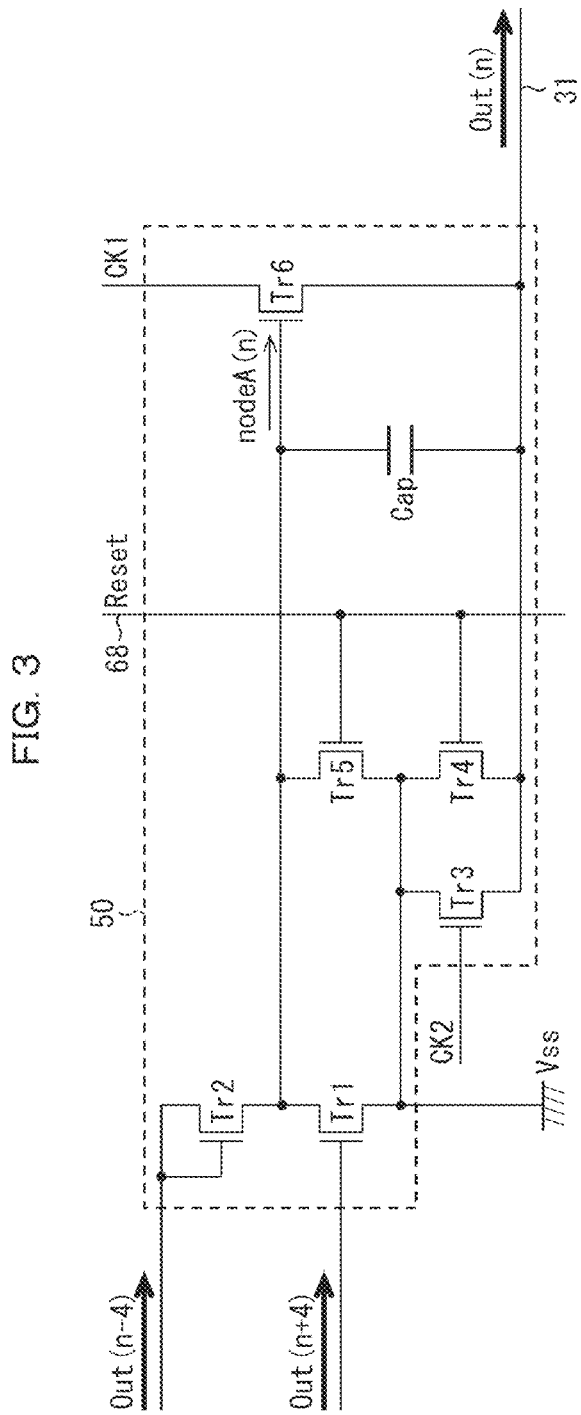
FIG. 3 is a circuit diagram illustrating a schematic circuit configuration of a unit circuit illustrated in FIG. 1.

FIG. 3 is a circuit diagram illustrating a schematic circuit configuration of the unit circuit 50 on the nth stage illustrated in FIG. 1, in which n satisfies two conditions that (i) n is larger than 4 and smaller than N−3 and (ii) a remainder after n is divided by 8 is 1 or 2.

In the aforementioned two conditions, (i) is a condition to exclude a start stage (n=1, 2, 3, 4) where sequential driving of the scanning line 31 starts and an end stage (n=N−3, N−2, N−1, N) where the driving ends. Further, (ii) is a condition to specify the clock signals CK1 to CK4 input to the unit circuit 50.

For simplification of the description, the unit circuit 50 on the nth stage that satisfies the aforementioned two conditions will be described in the present chapter. A unit circuit 50 on the nth stage that does not satisfy the aforementioned two conditions has the same configuration as the circuit configuration of the unit circuit 50 illustrated in FIG. 3 except that a signal that is input varies in accordance with n.

As illustrated in FIG. 3, the unit circuit 50 on the nth stage includes a first transistor Tr1 (circuit element), a second transistor Tr2, a third transistor Tr3, a fourth transistor Tr4, a fifth transistor Tr5, a sixth transistor Tr6, and a bootstrap capacitor Cap. Hereinafter, the first transistor Tr1, the second transistor Tr2, the third transistor Tr3, the fourth transistor Tr4, the fifth transistor Tr5, and the sixth transistor Tr6 are collectively referred to as "transistors Tr1 to Tr6".

The transistors Tr1 to Tr6 are (i) in a conductive state between a source and a drain while gate potential is equal to or more than the potential Vdd indicating "1" and (ii) in a non-conductive state between the source and the drain while the gate potential is the potential Vss indicating "0". The transistors Tr1 to Tr6 are thin film transistors (TFTs) of a bottom-gate type and a channel-etched type that are formed on the insulating substrate 21, but are not limited thereto. The transistors Tr1 to Tr6 may be thin film transistors of another type such as a top-gate type or an etch-stop type. The scanning line drive circuit 47 may be arranged on a semiconductor substrate and the transistors Tr1 to Tr6 may be transistors of another type such as metal oxide semiconductor (MOS) transistors. Similarly, the bootstrap capacitor Cap may be any capacitor.

To a gate electrode of the first transistor Tr1, an output OUT(n+4) of a unit circuit 50 on a subsequent stage is input.

To a source electrode of the first transistor Tr1, a source electrode of the third transistor Tr3, a source electrode of the fourth transistor Tr4, and a source electrode of the fifth transistor Tr5, the low potential Vss is supplied.

A drain electrode of the first transistor Tr1, a drain electrode of the second transistor Tr2, a drain electrode of the fifth transistor Tr5, one electrode of the bootstrap capacitor Cap, and a gate electrode of the sixth transistor Tr6 are connected to each other. Potential of the gate electrode of the sixth transistor Tr6 is defined as nodeA(n).

To a gate electrode and a source electrode of the second transistor Tr2, an output Out(n−4) of a unit circuit 50 on a previous stage is input.

To a gate electrode of the third transistor Tr3, the second clock signal CK2 is input.

A drain electrode of the third transistor Tr3, a drain electrode of the fourth transistor Tr4, the other electrode of the bootstrap capacitor Cap, a drain electrode of the sixth transistor Tr6, and the scanning line 31 are connected to each other. Further, potential of the electrodes is output as Out(n) to the scanning line 31 and the unit circuits 50 on the subsequent stage and the previous stage.

To a source electrode of the sixth transistor Tr6, the first clock signal CK1 is input. The scanning line 31 reaches the signal potential Vdd through the sixth transistor Tr6 (i) while the nodeA(n) has the signal potential Vdd indicating "1" through the second transistor Tr2 by the output Out(n−4), and further, (ii) when the first clock signal CK1 reaches the signal potential Vdd. Further, as the first clock signal CK1 is inverted from "0" to "1" and the scanning line 31 is charged to the signal potential Vdd, the potential of the gate electrode of the sixth transistor Tr6 and the potential of the one electrode of the bootstrap capacitor rise. Thus, the nodeA(n) has signal potential indicating "1+α" which is higher than the signal potential Vdd (α>0). Note that, α is responsive to a total capacity of capacity between the electrodes of the bootstrap capacitor Cap and capacity between the gate electrode and the train electrode of the sixth transistor Tr6.

After that, when the second clock signal CK2 is inverted from "0" to "1", the scanning line 31 is returned to an initial state of the signal potential Vss through the third transistor Tr3. Further, when the output Out(n+4) of the unit circuit 50 on the subsequent stage reaches the signal potential Vdd indicating "1", the nodeA(n) is returned to the initial state of Vss through the first transistor Tr1.

The sixth transistor Tr6 outputs drain potential to the scanning line 31 and is thus an output transistor of the unit circuit 50. Therefore, in order to achieve sufficiently high capability of being charged to the scanning line 31, the sixth transistor Tr6 preferably has low channel resistance when being in the conductive state between the source and the drain and has large source-drain current that is able to flow in the conductive state. Accordingly, the sixth transistor Tr6 preferably has a wide channel width and a short channel length. Thus, the sixth transistor Tr6 easily occupies a wider area on the insulating substrate 21 in plan view than those of the other transistors Tr1 to Tr5.

The bootstrap capacitor Cap is a capacitor that keeps a potential difference between the gate and the drain of the sixth transistor Tr6 and raises the potential of the nodeA(n) to higher potential so that Out(n) reaches the potential Vdd during an output period thereof, and thus preferably has sufficiently large capacity. Therefore, the bootstrap capacitor Cap also easily occupies a wider area on the insulating substrate 21 in plan view than those of the transistors Tr1 to Tr5 other than the sixth transistor Tr6.

With such a circuit configuration, the output Out(n) of the unit circuit 50 on the nth stage is obtained as indicated by a table 1.

TABLE 1

| | Input | | | | | Output |
|---|---|---|---|---|---|---|
| Reset | CK1 | CK2 | Out (n − 4) | Out (n + 4) | nodeA (n) | Out (n) |
| 0 | 0 | 1 | 1 | 0 | 1 | 0 |
| 0 | 1 | 0 | 0 | 0 | 1 + α | 1 |
| 0 | 0 | 1 | 0 | 1 | 0 | 0 |
| 0 | 1 | 0 | 0 | 0 | 0 | 0 |
| 0 | 0 | 1 | 0 | 0 | 0 | 0 |

*α > 0

Until sequential driving of the scanning line 31 starts from the start stage and ends at the end stage, the initialization signal Reset=0 is provided, but immediately after the driving ends at the end stage or before the driving starts again from the start stage, the initialization signal Reset=1 is provided and the nodeA(n) of each stage is returned to the initial state of Vss. Similarly, the scanning line 31 is also returned to the initial state of the low potential Vss. Then, immediately before the driving starts from the start stage, the initialization signal Reset=0 is provided again. By regularly and simultaneously returning the nodeA(n) of each stage and the scanning line 31 to the initial state by using the initialization signal, an erroneous operation of the scanning line drive circuit 47 in a long-time operation is able to be suppressed.

Note that, the unit circuit 50 illustrated in FIG. 3 is an example and does not limit the scope of the invention. The unit circuit 50 may be a flip-flop circuit having another circuit configuration or a circuit other than a flip-flop circuit. Further, the scanning line drive circuit 47 may include unit circuits 50 of a plurality of types that have different circuit configurations.

(Circuit Arrangement of Drive Circuit)

Figure 4:
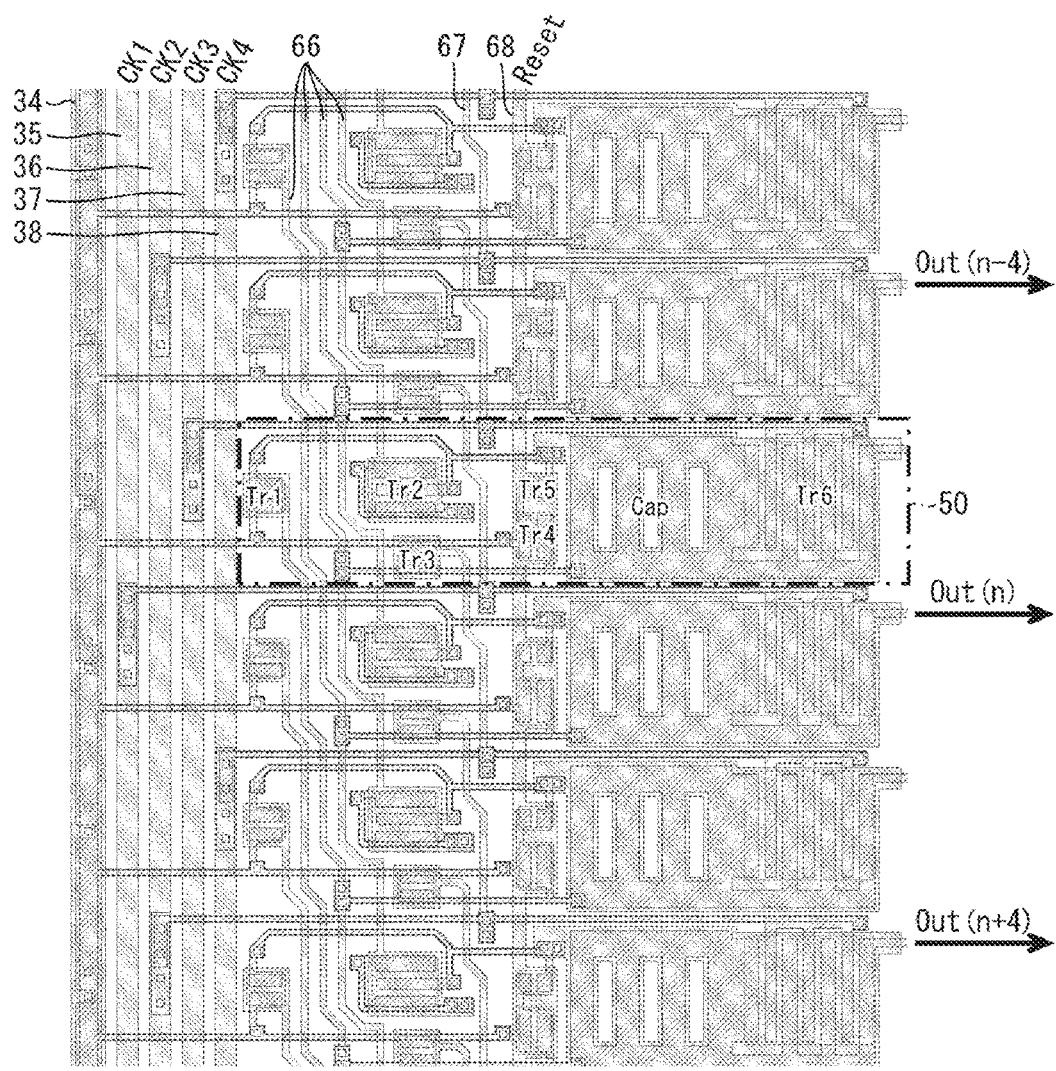
FIG. 4 is a plan view schematically illustrating circuit arrangement of a scanning line drive circuit illustrated in FIG. 1.

FIG. 4 is a plan view schematically illustrating circuit arrangement of the scanning line drive circuit 47 illustrated in FIG. 1.

As illustrated in FIG. 4, the scanning line drive circuit 47 further includes a first relay wire 66 (first-type wire), a second relay wire 67, and the initialization wire 68 that connect the unit circuits 50. In Embodiment 1, the initialization wire 68 passes through the inner side of the scanning line drive circuit 47 and is connected to the plurality of unit circuits 50. Thus, the initialization wire 68 is a wire that supplies the initialization signal Reset to the scanning line drive circuit 47 and is also a wire that connects the unit circuits 50.

The first relay wire 66 is a relay wire that supplies the output Out(n) of the unit circuit 50 on the nth stage to a gate electrode of a first transistor of a unit circuit 50 on an (n−4)th stage and a gate electrode of a second transistor of a unit circuit 50 on an (n+4)th stage. Thus, the first relay wire 66 that supplies the output Out(n) extends over five unit circuits 50 on the (n−4)th stage, an (n−2)th stage, the nth stage, an (n+2)th stage, and the (n+4)th stage. Moreover, the first relay wire 66 that supplies the output Out(n) connects (i) the unit circuits 50 on the (n−4)th stage and the nth stage and connects (ii) the unit circuits 50 on the nth stage and the (n+4)th stage.

The second relay wire 67 is a relay wire that extends from (i) a branch wire that supplies any of the clock signals CK1 to CK4 to the source electrode of the sixth transistor Tr6 of the unit circuit 50 on the nth stage to (ii) a gate electrode of the third transistor Tr3 of the unit circuit 50 on the (n−4)th stage. The second relay wire 67 is also a relay wire that supplies any of the clock signals CK1 to CK4. Thus, the second relay wire 67 that supplies any of the clock signals CK1 to CK4 from the unit circuit 50 on the nth stage extends over three unit circuits 50 on the (n−4)th stage, the (n−2)th stage, and the nth stage. The second relay wire 67 that supplies any of the clock signals CK1 to CK4 from the branch wire of the unit circuit 50 on the nth stage connects the unit circuits 50 on the (n−4)th stage and the nth stage.

The initialization wire 68 supplies the initialization signal Reset directly to gate electrodes of fourth transistors Tr4 and fifth transistors Tr5 of the respective unit circuits 50. Thus, the initialization wire 68 extends over all unit circuits 50 on odd-numbered stages and over all unit circuits 50 on even-numbered stages. Further, the initialization wire 68 connects (i) the unit circuits 50 on the (n−2)th stage and the nth stage and connects (ii) the unit circuits 50 on the nth stage and the (n+2)th stage.

The first relay wire 66, the second relay wire 67, and the initialization wire 68 are wires that extend substantially in parallel to the data lines 32 and are wires formed by a gate layer 22 (refer to FIG. 7) as described below.

(Circuit Arrangement of Unit Circuit)

Figure 5:
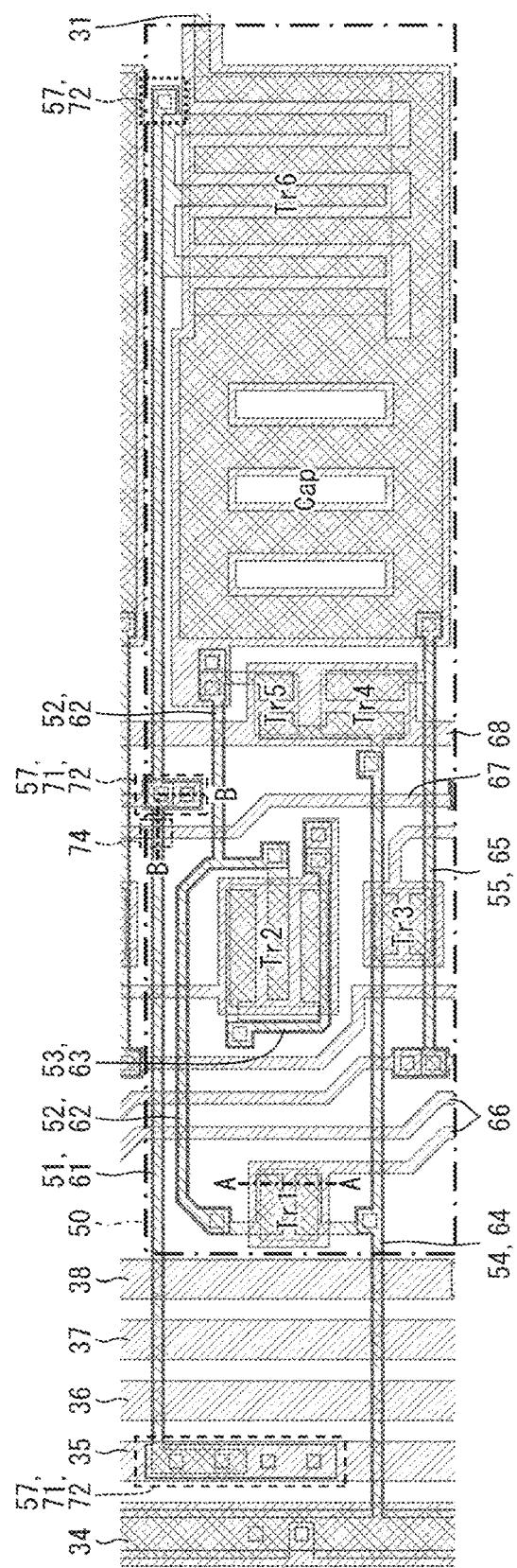
FIG. 5 is a plan view schematically illustrating circuit arrangement of the unit circuit illustrated in FIG. 4.

FIG. 5 is a plan view schematically illustrating circuit arrangement of the unit circuit 50 illustrated in FIG. 4. In FIG. 5, similarly to FIG. 3, n that satisfies two conditions that (i) n is larger than 4 and smaller than N−3 and (ii) a remainder after n is divided by 8 is 1 or 2 is indicated.

For simplification of the description, the unit circuit 50 on the nth stage that satisfies the aforementioned two conditions will be described in the present chapter. A unit circuit 50 on the nth stage that does not satisfy the aforementioned two conditions is arranged in the same manner as in the circuit arrangement of the unit circuit 50 illustrated in FIG. 5 except that a trunk wire to be connected among the clock trunk wires 35 to 38 and/or a connection destination of the first relay wire 66 and/or the second relay wire 67 vary in accordance with n.

As illustrated in FIG. 5, the unit circuit 50 on the nth stage further includes a first branch wire 61 (second-type wire), a second branch wire 62, a third branch wire 63, a fourth branch wire 64, a fifth branch wire 65, a first redundant wire 51 (third-type wire) corresponding to the first branch wire 61, a second redundant wire 52 corresponding to the second branch wire 62, a third redundant wire 53 corresponding to the third branch wire 63, a fourth redundant wire 54 corresponding to the fourth branch wire 64, and a fifth redundant wire 55 corresponding to the fifth branch wire 65. Hereinafter, the first branch wire 61, the second branch wire 62, the third branch wire 63, the fourth branch wire 64, and the fifth branch wire 65 are collectively referred to as "branch wires 61 to 65". Further, the first redundant wire 51, the second redundant wire 52, the third redundant wire 53, the fourth redundant wire 54, and the fifth redundant wire 55 are collectively referred to as "redundant wires 51 to 55".

The branch wires 61 to 65 are wires formed by a source layer 25 (refer to FIG. 9) as described below. The redundant wires 51 to 55 are wires formed by a redundant wire layer 27 (refer to FIG. 11) as described below.

The first redundant wire 51 includes, at a left end of FIG. 5, a reconnection portion 71 by which the first branch wire 61 is connected to the first clock trunk wire 35. The first redundant wire 51 includes, at a center, a reconnection portion 71 by which the first branch wire 61 is connected to the second relay wire 67. The first redundant wire 51 includes, at a right end of FIG. 5, a connection portion 57 (second-type connection portion) that allows connection to the first branch wire 61. In Embodiment 1, each of the reconnection portions 71 provided in the first redundant wire 51 at the left end and the center of FIG. 5 also serves as the connection portion 57 that allows connection to the first branch wire 61.

The first branch wire 61 is a branch wire by which the source electrode of the sixth transistor Tr6 is connected to the first clock trunk wire 35. The first branch wire 61 is a branch wire that supplies the first clock signal CK1. The first branch wire 61 includes, at the left end of FIG. 5, a connection portion 72 (serving as the first-type connection portion and a third-type connection portion) that allows (i) connection to the first redundant wire 51 and (ii) connection to the first clock trunk wire 35 through the reconnection portion 71 of the first redundant wire 51. The first branch wire 61 includes, at the center, a connection portion 72 that allows (i) connection to the first redundant wire 51 and (ii) connection to the second relay wire 67 through the reconnection portion 71 of the first redundant wire 51. The first branch wire 61 includes, at the right end of FIG. 5, a connection portion 72 that allows connection to the connection portion 57 of the first redundant wire 51. The first branch wire 61 is formed to be integrated with the source electrode of the sixth transistor Tr6.

The second redundant wire 52 includes, at the left end of FIG. 5, a connection portion 57 that allows connection to the second branch wire 62. The second redundant wire 52 includes, at an end near the drain electrode of the second transistor Tr2, a connection portion 57 that allows connection to the second branch wire 62. The second redundant wire 52 includes, at the right end of FIG. 5, a reconnection portion 71 by which the second branch wire 62 is connected to the one electrode of the bootstrap capacitor Cap, which is integrated with the gate electrode of the sixth transistor Tr6. In Embodiment 1, the reconnection portion 71 provided in the second redundant wire 52 at the right end of FIG. 5 also serves as the connection portion 57 that allows connection to the second branch wire 62.

The second branch wire 62 is a branch wire by which the one electrode of the bootstrap capacitor Cap, which is integrated with the gate electrode of the sixth transistor Tr6, is connected to the drain electrodes of the first transistor Tr1, the second transistor Tr2, and the fifth transistor Tr5. The second branch wire 62 includes, at the left end of FIG. 5, a connection portion 72 that allows connection to the second redundant wire 52. The second branch wire 62 includes, at the end near the drain electrode of the second transistor Tr2, a connection portion 72 that allows connection to the second redundant wire 52. The second branch wire 62 includes, at a right bent part of FIG. 5, a connection portion 72 that allows (i) connection to the second redundant wire 52 and (ii) connection to the one electrode of the bootstrap capacitor Cap through the reconnection portion 71 of the second redundant wire 52. The second branch wire 62 is formed to be integrated with the drain electrodes of the first transistor Tr1, the second transistor Tr2, and the fifth transistor Tr5.

The third redundant wire 53 includes, at an upper-left end of FIG. 5, a connection portion 57 that allows connection to the third branch wire 63. The third redundant wire 53 includes, at a lower-right end of FIG. 5, a reconnection portion 71 by which the third branch wire 63 is connected to the gate electrode of the second transistor Tr2. In Embodiment 1, the reconnection portion 71 provided in the third redundant wire 53 at the lower-right end of FIG. 5 also serves as the connection portion 57 that allows connection to the third branch wire 63.

The third branch wire 63 causes two divided source electrodes of the second transistor Tr2 to be coupled and connects the source electrodes of the second transistor Tr2 to the gate electrode of the second transistor Tr2. The third branch wire 63 includes, at an upper-left bent part of FIG. 5, a connection portion 72 that allows (i) connection to the third redundant wire 53. The third branch wire 63 includes, at the lower-right end of FIG. 5, a connection portion 72 that allows (i) connection to the third redundant wire 53 and (ii) connection to the gate electrode of the second transistor Tr2 through the reconnection portion 71 of the third redundant wire 53. The third branch wire 63 is formed to be integrated with the source electrodes of the second transistor Tr2. The third branch wire 63 is formed to be integrated with the two source electrodes of the second transistor Tr2.

The fourth redundant wire 54 includes, at the left end of FIG. 5, a reconnection portion 71 by which the fourth branch wire 64 is connected to the low-potential trunk wire 34. The fourth redundant wire 54 includes, at the center and the right end of FIG. 5, connection portions 57 that allow connection to the fourth branch wire 64. In Embodiment 1, the reconnection portion 71 provided in the fourth redundant wire 54 at the left end of FIG. 5 also serves as a connection portion 57 that allows connection to the fourth branch wire 64.

The fourth branch wire 64 is a branch wire by which the low-potential trunk wire 34 is connected to the source electrodes of the first transistor Tr1, the third transistor Tr3, the fourth transistor Tr4, and the fifth transistor Tr5. The fourth branch wire 64 is a branch wire that supplies the low potential Vss. The fourth branch wire 64 includes, at the left end of FIG. 5, a connection portion 72 that allows (i) connection to the fourth redundant wire 54 and (ii) connection to the low-potential trunk wire 34 through the reconnection portion 71 of the fourth redundant wire 54. The fourth branch wire 64 includes, at a branch part branching toward the source electrode of the first transistor Tr1, a connection portion 72 that allows connection to the fourth redundant wire 54. The fourth branch wire 64 includes, near the source electrode of the fourth transistor Tr4, a connection portion 72 that allows connection to the fourth redundant wire 54. The fourth branch wire 64 is formed to be integrated with the source electrodes of the first transistor Tr1, the third transistor Tr3, the fourth transistor Tr4, and the fifth transistor Tr5.

The fifth redundant wire 55 includes, at the left end of FIG. 5, a reconnection portion 71 by which the fifth branch wire 65 is connected to the first relay wire 66. The fifth redundant wire includes, at the right end of FIG. 5, a connection portion 57 that allows connection to the fifth branch wire 65. In Embodiment 1, the reconnection portion 71 provided in the fifth redundant wire 55 at the right end of FIG. 5 also serves as the connection portion 57 that allows connection to the fifth branch wire 65.

The fifth branch wire 65 is a branch wire by which the first relay wire 66, the drain electrode of the third transistor Tr3, the drain electrode of the fourth transistor Tr4, and the other electrode of the bootstrap capacitor Cap, which is integrated with the drain electrode of the sixth transistor Tr6, are connected. The fifth branch wire 65 is a branch wire that supplies the output Out(n) of the unit circuit 50 on the nth stage. The fifth branch wire 65 includes, at the left end of FIG. 5, a connection portion 72 that allows (i) connection to the fifth redundant wire 55 and (ii) connection to the first relay wire 66 through the reconnection portion 71 of the fifth redundant wire 55. The fifth branch wire 65 includes, at the right end of FIG. 5, a connection portion 72 that allows (i) connection to the fifth redundant wire 55. The fifth branch wire 65 is formed to be integrated with the drain electrode of the third transistor Tr3, the drain electrode of the fourth transistor Tr4, and the other electrode of the bootstrap capacitor Cap.

The reconnection portions 71 are short-distance wires by which the branch wires 61 to 65 formed by the source layer 25 (refer to FIG. 9) are reconnected to the wires (the low-potential trunk wire 34, the clock trunk wires 35 to 38, the first relay wire 66, and the second relay wire 67) formed by the gate layer 22 (refer to FIG. 7) or the electrodes (the gate electrode of the second transistor Tr2, and the one electrode of the bootstrap capacitor Cap, which is integrated with the gate electrode of the sixth transistor Tr6). The reconnection portions 71 are provided to be integrated with the redundant wires 51 to 55 in Embodiment 1, but are not limited thereto and may be provided separately from the redundant wires 51 to 55 as in Embodiment 2 described below.

The redundant wires 51 to 55 according to Embodiment 1 are entirely overlapped with the corresponding branch wires 61 to 65 except for the reconnection portions 71, but there is no limitation thereto. The redundant wires 51 to 55 may not be overlapped or may be partially overlapped with the corresponding branch wires 61 to 65. In an overlapping section, the redundant wires 51 to 55 are preferably thinner than the corresponding branch wires 61 to 65.

The first relay wire 66 and the second relay wire 67 cross the branch wires 61 to 65 at a crossing portion 74, but do not cross the transistors Tr1 to Tr5 or the bootstrap capacitor Cap.

According to the aforementioned configurations of the branch wires 61 to 65 and the redundant wires 51 to 55, each of the branch wires 61 to 65 includes a plurality of connection portions 72. Further, each of the redundant wires 51 to 55 includes a plurality of connection portions 57 (including the connection portion 57 integrated with the reconnection portion 71) that allow connection to the respective connection portions 72 of the corresponding branch wires 61 to 65. Thus, the branch wires 61 to 65 and the redundant wires 51 to 55 that correspond to each other are connected through connection of the connection portions 72 and the connection portions 57. Thereby, the connection portions 72 that are connected by the branch wires 61 to 65 are also connected by the corresponding redundant wires 51 to 55. Accordingly, the branch wires 61 to 65 are branched by the redundant wires 51 to 55.

Probability that both of two wires are disconnected is lower than probability that one wire is disconnected. Thus, the branching makes it possible to reduce a defect of the unit circuit 50 caused when the branch wires 61 to 65 are disconnected, and reduce a defect of the scanning line drive circuit 47.

(Layered Structure of Transistor)

Figure 6:
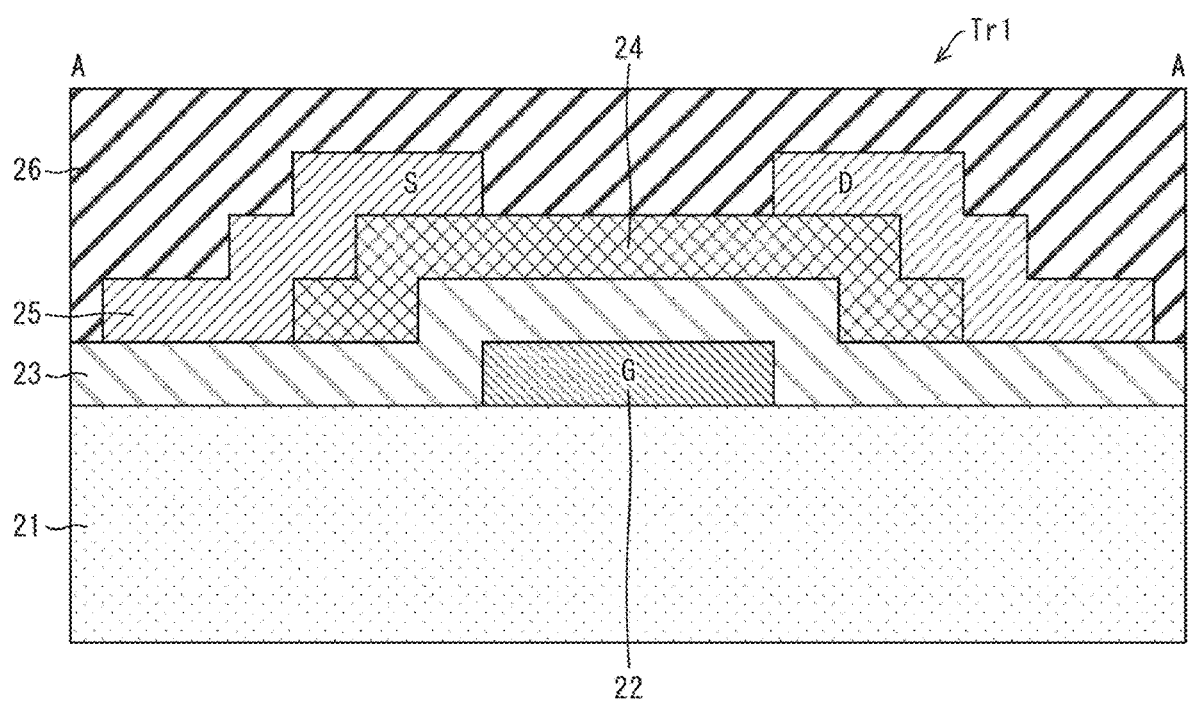
FIG. 6 is a sectional view taken along a line A-A of FIG. 5.

FIG. 6 is a sectional view taken along a line A-A of FIG. 5 and a sectional view illustrating a schematic layered structure of the first transistor Tr1. Though description will be omitted, the transistors Tr2 to Tr6 other than the first transistor Tr1 also have a similar layered structure.

The first transistor Tr1 according to Embodiment 1 is a TFT of the bottom-gate type and the channel-etched type. Thus, the first transistor is formed on the insulating substrate 21 and includes a gate electrode (G) formed by the gate layer 22 (first conductive layer), a gate insulating film 23, a channel formed by a semiconductor layer 24, a source electrode (S) and a drain electrode (D) formed by the source layer 25 (second conductive layer), and a first interlayer insulating film 26.

The insulating substrate 21 is a substrate that supports the scanning line drive circuit 47. The insulating substrate 21 may be formed by any material as long as being a material having an insulating property, and a glass substrate or a plastic substrate made from polyethylene terephthalate, polyimide, or the like may be used, for example.

The gate layer 22 is a conductive layer formed on the insulating substrate 21. The gate layer 22 is able to be formed by a metal material, for example, such as titanium (Ti), copper (Cu), chromium (Cr), aluminum (Al), gold (Au), molybdenum (Mo), tungsten (W), or an alloy thereof.

The gate insulating film 23 is an insulating film formed so as to cover surfaces of the insulating substrate 21 and the gate layer 22. The gate insulating film 23 may be formed, for example, by an organic insulating material such as polyparavinylphenol (PVP) or an inorganic insulating material such as silicon dioxide ($SiO_2$) or silicon nitride ($SiN_x$).

The semiconductor layer 24 is a semiconductor layer that is formed on the gate insulating film 23 and makes the source electrode (S) and the drain electrode (D) conductive. The semiconductor layer 24 may be constituted by, for example, an oxide semiconductor.

The oxide semiconductor constituting the semiconductor layer 24 may be an amorphous oxide semiconductor or a crystalline oxide semiconductor having a crystalline part. A polycrystalline oxide semiconductor, a microcrystalline oxide semiconductor, or a crystalline oxide semiconductor in which a c-axis is oriented substantially perpendicular to a layer surface, or the like is cited as the crystalline oxide semiconductor.

The semiconductor layer 24 constituted by the oxide semiconductor may have a layered structure of two or more layers. In a case where the semiconductor layer 24 has a layered structure, the semiconductor layer 24 may include an amorphous oxide semiconductor layer and a crystalline oxide semiconductor layer. The semiconductor layer 24 may include a plurality of crystalline oxide semiconductor layers having different crystal structures. In addition, the semiconductor layer 24 may include a plurality of amorphous oxide semiconductor layers.

In a case where the semiconductor layer 24 has a two-layer structure including an upper layer (opposite to the substrate) and a lower layer (substrate side), an energy gap of the oxide semiconductor included in the upper layer is preferably greater than an energy gap of the oxide semiconductor included in the lower layer. In a case where a difference in the energy gap between the layers is relatively small, however, the energy gap of the oxide semiconductor in the lower layer may be greater than the energy gap of the oxide semiconductor in the upper layer.

For example, Japanese Unexamined Patent Application Publication No. 2014-007399 describes a material, a structure, and a film formation method of the amorphous oxide semiconductor and each of the aforementioned crystalline oxide semiconductors, a configuration of an oxide semiconductor layer having a layered structure, and the like. The entire contents disclosed in Japanese Unexamined Patent Application Publication No. 2014-007399 are incorporated into the present specification by reference.

The semiconductor layer 24 may contain at least one kind of metal element from among In, Ga, and Zn, for example. In the present embodiment, the semiconductor layer 24 contains, for example, an In—Ga—Zn—O semiconductor (for example, indium gallium zinc oxide). Here, the In—Ga—Zn—O semiconductor is a ternary oxide of In (indium), Ga (gallium), and Zn (zinc), and a ratio (composition ratio) of In, Ga, and Zn is not particularly limited and includes, for example, In:Ga:Zn=2:2:1, In:Ga:Zn=1:1:1, In:Ga:Zn=1:1:2, or the like. Such an oxide semiconductor layer is able to be formed from an oxide semiconductor layer containing an In—Ga—Zn—O semiconductor.

The In—Ga—Zn—O semiconductor may be amorphous or crystalline. For a crystalline In—Ga—Zn—O semiconductor, a crystalline In—Ga—Zn—O semiconductor in which a c-axis is oriented substantially perpendicular to a layer surface is preferable.

Note that, for example, Japanese Unexamined Patent Application Publications No. 2014-007399 described above, No. 2012-134475, No. 2014-209727, and the like disclose crystal structures of crystalline In—Ga—Zn—O semiconductors. The entire contents disclosed in Japanese Unexamined Patent Application Publications No. 2012-134475 and No. 2014-209727 are incorporated into the present specification by reference.

A thin film transistor having an In—Ga—Zn—O semiconductor layer has a high mobility (greater than 20 times that of an a-Si TFT) and a low leak current (less than 1/100th that of the a-Si TFT), and is thus suitably used as the transistors Tr1 to Tr6 provided in the scanning line drive circuit 47 and the pixel transistor arranged in the display region 30.

The semiconductor layer 24 may contain another oxide semiconductor instead of an In—Ga—Zn—O semiconductor. For example, the semiconductor layer 24 may contain an In—Sn—Zn—O semiconductor (for example, $In_2O_3$—$SnO_2$—ZnO; InSnZnO). The In—Sn—Zn—O semiconductor is a ternary oxide of In (indium), Sn (tin), and Zn (zinc). The oxide semiconductor layer may contain an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, CdO (cadmium oxide), a Mg—Zn—O semiconductor, an In—Ga—Sn—O semiconductor, an In—Ga—O semiconductor, a Zr—In—Zn—O semiconductor, a Hf—In—Zn—O semiconductor, or the like.

The source layer 25 is able to be formed by a metal material, for example, such as titanium (Ti), copper (Cu), chromium (Cr), gold (Au), aluminum (Al), molybdenum (Mo), tungsten (W), or an alloy thereof.

The first interlayer insulating film 26 fills a space between the source electrode (S) and the drain electrode (G) which are formed by the source layer 25 so as to be separated from each other on the gate insulating film 23 and the semiconductor layer 24. The first interlayer insulating film 26 is provided on upper surfaces of the gate insulating film 23, the semiconductor layer 24, and the source layer 25. A material of the first interlayer insulting film 26 may be the same insulating material as that of the gate insulating film 23 or an insulating material different from that of the gate insulating film 23.

The layers (the gate layer 22, the gate insulating film 23, the semiconductor layer 24, the source layer 25, and the first interlayer insulating film 26) constituting the transistors Tr1 to Tr6 provided in the scanning line drive circuit 47 are preferably layers constituting the pixel transistor arranged in the display region 30.

(Production Process of Scanning Line Drive Circuit)

A schematic process of producing the scanning line drive circuit 47 illustrated in FIG. 4 will be described below with reference to FIGS. 7 to 11. Note that, though description will be omitted, components of the data line drive circuit 48, and the pixel transistor and the pixel electrode in the display region 30 are also formed on the insulating substrate 21 with the scanning line drive circuit 47.

Figure 7:
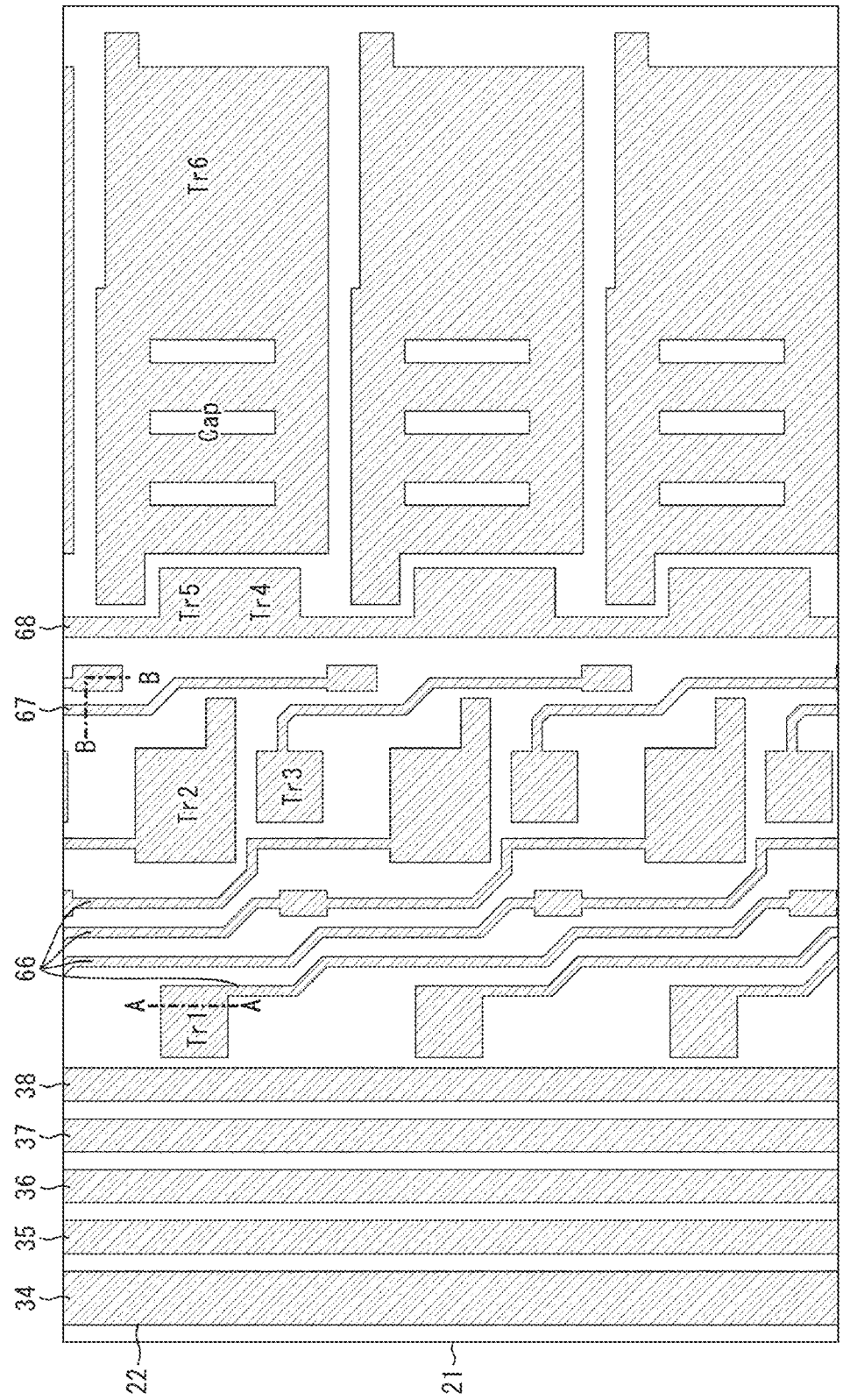
FIG. 7 is a plan view illustrating a schematic pattern of a gate layer of the scanning line drive circuit illustrated in FIG. 4.

FIG. 7 is a plan view illustrating a schematic pattern of the gate layer 22 of the scanning line drive circuit 47 illustrated in FIG. 4.

Figure 8:
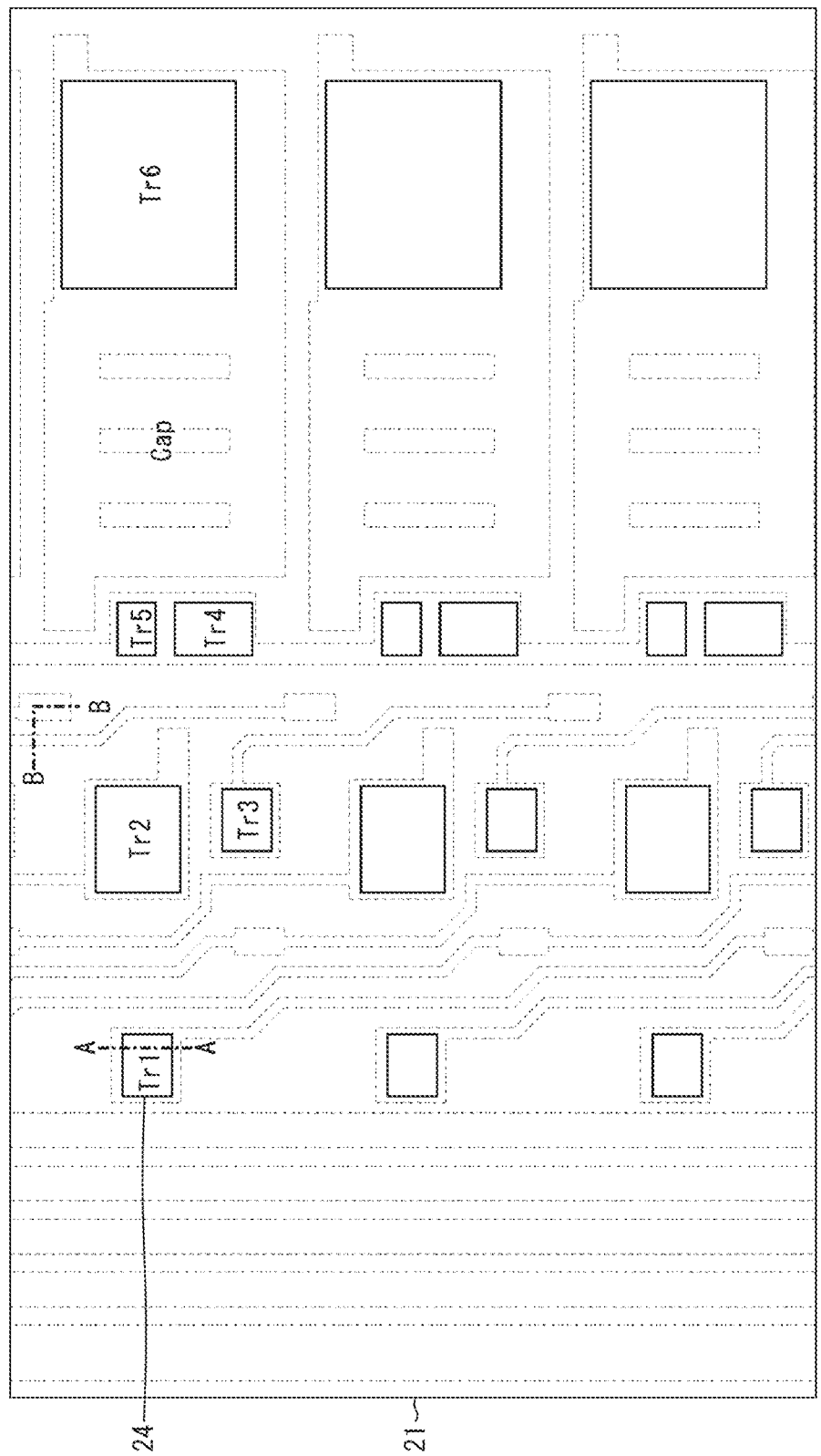
FIG. 8 is a plan view illustrating a schematic pattern of a semiconductor layer of the scanning line drive circuit illustrated in FIG. 4.

FIG. 8 is a plan view illustrating a schematic pattern of the semiconductor layer 24 of the scanning line drive circuit 47 illustrated in FIG. 4.

Figure 9:
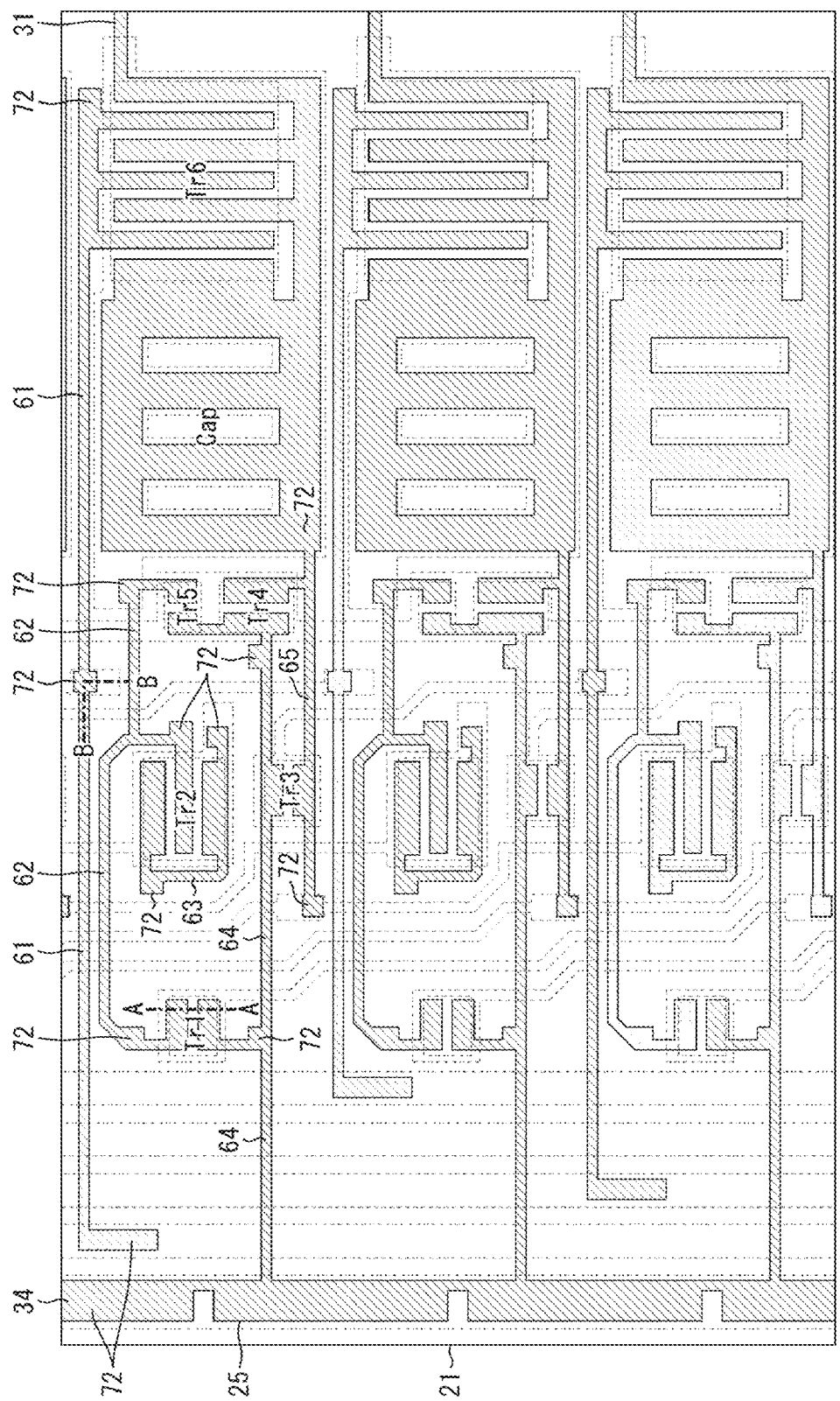
FIG. 9 is a plan view illustrating a schematic pattern of a source layer of the scanning line drive circuit illustrated in FIG. 4.

FIG. 9 is a plan view illustrating a schematic pattern of the source layer 25 of the scanning line drive circuit 47 illustrated in FIG. 4.

Figure 10:
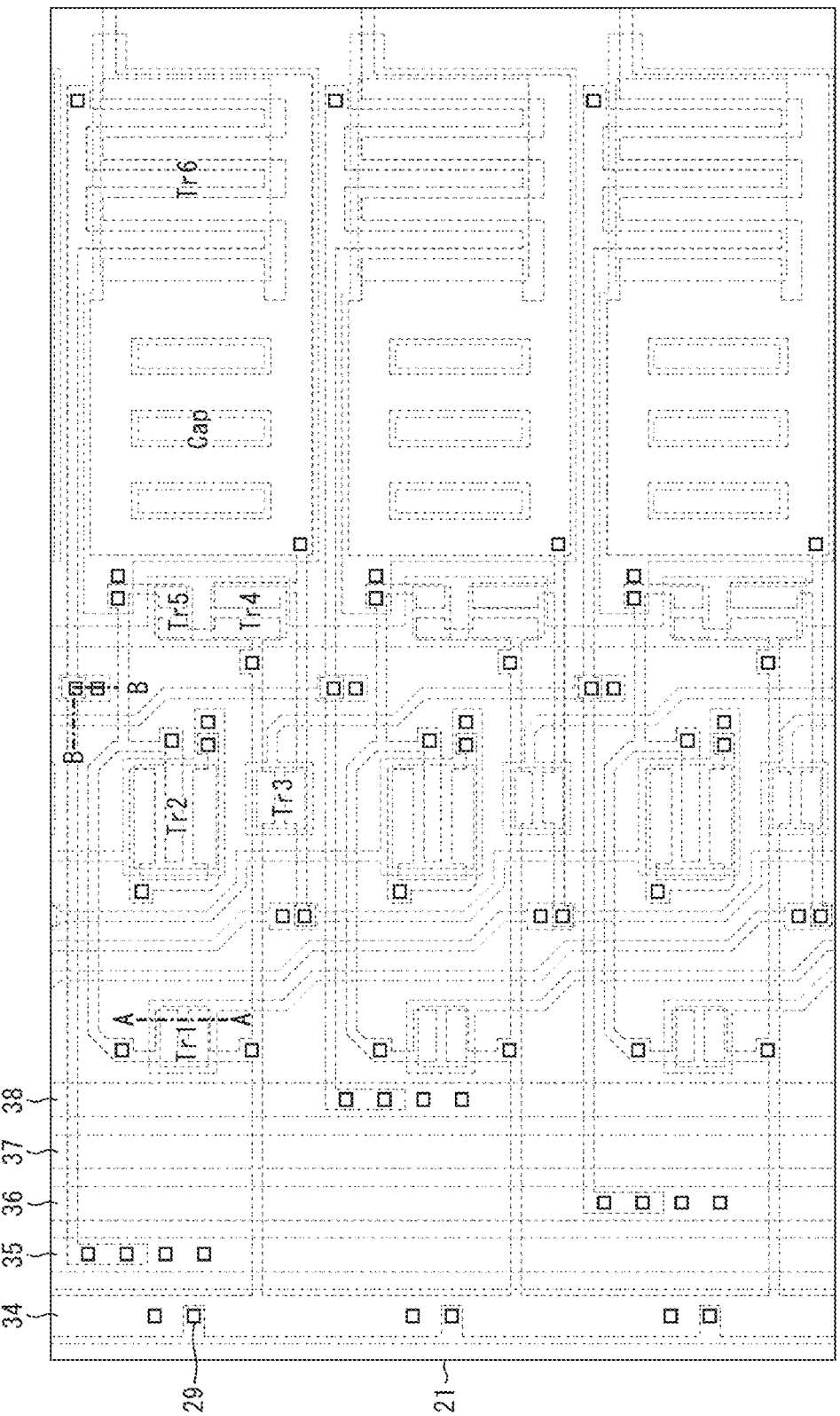
FIG. 10 is a plan view illustrating a schematic pattern of a contact hole of the scanning line drive circuit illustrated in FIG. 4.

FIG. 10 is a plan view illustrating a schematic pattern of a contact hole 29 of the scanning line drive circuit 47 illustrated in FIG. 4.

Figure 11:
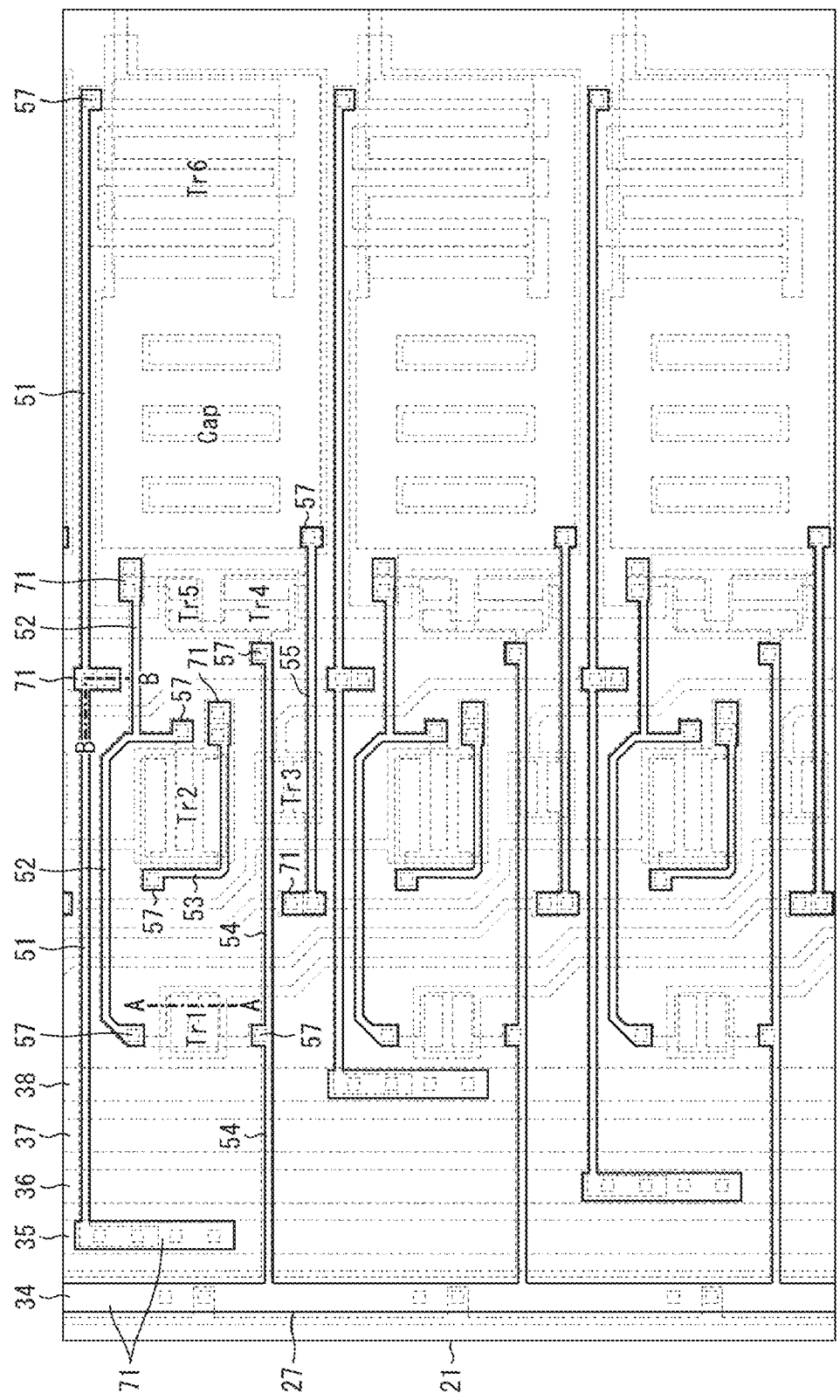
FIG. 11 is a plan view illustrating a schematic pattern of a redundant wire layer of the scanning line drive circuit illustrated in FIG. 4.

FIG. 11 is a plan view illustrating a schematic pattern of the redundant wire layer 27 of the scanning line drive circuit 47 illustrated in FIG. 4.

First, a conductive material is deposited entirely on the insulating substrate 21 to form the gate layer 22. After that, the gate layer 22 is subjected to etching by using a photolithography technique or the like so that the gate layer 22 remains with a pattern as in FIG. 7. Thereby, the low-potential trunk wire 34, the clock trunk wires 35 to 38, the gate electrodes of the transistors Tr1 to Tr6, the one electrode of the bootstrap capacitor Cap, the first relay wire 66, the second relay wire 67, and the initialization wire 68 are formed as in FIG. 7.

Then, the gate insulating film 23 is entirely deposited on the insulating substrate 21 over the gate layer 22. The gate insulating film 23 is an insulating film that forms gate insulating films of the transistors Tr1 to Tr6 provided in the scanning line drive circuit 47. It is preferable that the gate insulating film 23 is also an insulating film that forms a gate insulating film of the pixel transistor arranged in the display region 30.

Next, a semiconductor material is entirely deposited on the insulating substrate 21 over the gate insulating film 23 to form the semiconductor layer 24. After that, the semiconductor layer 24 is subjected to etching by using the photolithography technique or the like so that the semiconductor layer 24 remains with a pattern as in FIG. 8. Thereby, the semiconductor layer 24 serving as a channel of the transistors Tr1 to Tr6 is formed as in FIG. 8.

Next, a conductive material is entirely deposited on the insulating substrate 21 over the semiconductor layer 24 to form the source layer 25. After that, the source layer 25 is subjected to etching by using the photolithography technique or the like so that the source layer 25 remains with a pattern as in FIG. 9. Thereby, the source electrodes and the drain electrodes of the transistors Tr1 to Tr6, the branch wires 61 to 65, the one electrode of the bootstrap capacitor Cap, and the scanning line 31 are formed as in FIG. 9. Note that, the scanning line 31 is formed in the gate layer 22 in the display region 30. The scanning line 31 that is formed to be integrated with the one electrode of the bootstrap capacitor Cap is formed by the source layer 25, but is reconnected to the gate layer 22 outside the display region 30 (inside the peripheral region 40).

As illustrated in FIG. 9, the connection portion 72 of the fourth branch wire 64, which allows connection to the low-potential trunk wire 34, is preferably arranged so that connection portions 72 of unit circuits 50 on a plurality of stages are continuous to be overlapped with the low-potential trunk wire 34. The connection portions 72 arranged in this manner function like another low-potential trunk wire 34, thus making it possible to reduce wiring resistance of the low-potential trunk wire 34.

Then, an insulating material is entirely deposited on the insulating substrate 21 over the source layer 25 to form the first interlayer insulating film 26.

Next, the contact hole 29 is formed as in FIG. 10 by using the photolithography technique or the like. At a position (the connection portions 72 of the branch wires 61 to 65) where the source layer 25 remains, the first interlayer insulating film 26 is subjected to etching to expose the source layer 25 from the contact hole 29. At a position where the source layer 25 is removed and the gate layer 22 remains, the first interlayer insulating film 26 and the gate insulating film 23 are subjected to etching to expose the gate layer 22 from the contact hole 29.

Next, a conductive material is entirely deposited on the insulating substrate 21 over the first interlayer insulating film 26 to form the redundant wire layer 27 (third conductive layer). After that, the redundant wire layer 27 is subjected to etching by using the photolithography technique or the like so that the redundant wire layer 27 remains with a pattern as in FIG. 11. Thereby, the redundant wires 51 to 55 are formed and the conductive material forming the redundant wire layer 27 is buried in the contact hole 29. Thus, the redundant wire layer 27 is connected to the gate layer 22 through the contact hole 29 from which the gate layer 22 is exposed. Further, the redundant wire layer 27 is connected to the source layer 25 through the contact hole 29 from which the source layer 25 is exposed.

A metal material, for example, such as copper (Cu), titanium (Ti), aluminum (Al), or an alloy thereof is usable for the redundant wire layer 27. The redundant wire layer 27 may be a wire that reduces resistance of a common electrode which is arranged in a display region and forms auxiliary capacitance in a TN (twisted nematic) system or a VA (vertical aligned) system or a common electrode in an FFS (fringe field switching) system, or may be a conductive layer for a channel light shielding film of a TFT. It is preferable that the redundant wire layer 27 is such an existing conductive layer, because the number of wire layers is not increased.

As illustrated in FIG. 11, the reconnection portion 71 of the fourth redundant wire 54, by which the fourth branch wire 64 is connected to the low-potential trunk wire 34, is preferably arranged so that reconnection portions 71 of unit circuits 50 on different stages are continuous to be overlapped with the low-potential trunk wire 34. The reconnection portions 71 arranged in this manner function like another low-potential trunk wire 34, thus making it possible to reduce wiring resistance of the low-potential trunk wire 34.

A configuration in which the redundant wires 51 to 55 are overlapped with the corresponding branch wires 61 to 65 as illustrated in FIG. 11 reduces wiring capacity and makes it easy to form a seal 11 (refer to FIG. 13) on the scanning line drive circuit 47, and is thus preferable. Photosetting resin is used for the seal 11 in many cases. Thus, in order to enable formation of the seal 11 on the scanning line drive circuit 47, it is preferable that a light transmission portion through which light that cures photosetting resin is able to be transmitted is able to be arranged in the scanning line drive circuit 47. Note that, three slits of the one electrode of the bootstrap capacitor Cap illustrated in FIG. 6 that is formed by the gate layer 22 serve as the light transmission portion through which light that cures photosetting resin is able to be transmitted.

Further, it is more preferable that the redundant wires 51 to 55 are thinner than the corresponding branch wires 61 to 65 in the overlapping section as illustrated in FIG. 11, because this makes easy to form the seal 11 (refer to FIG. 13) on the scanning line drive circuit 47. When the redundant wires 51 to 55 which are opposite to the insulating substrate 21 are thin, it is possible to cure a seal material more easily. Further, three slits of the other electrode of the bootstrap capacitor Cap that is formed by the source layer 25 are larger than the slits of the one electrode so that the seal material is able to be more easily cured similarly.

Then, an insulating material is entirely deposited on the insulating substrate 21 over the source layer 25 to form a second interlayer insulating film 28. A material of the second interlayer insulating film 28 may be the same insulating material as that of the first interlayer insulating film 26 or may be an insulating material different from that of the first interlayer insulating film 26. For example, the second interlayer insulating film 28 may be silicon nitride ($SiN_x$) having a thickness of 0.2 mm to 0.8 mm.

(Partial Sectional Surface of Scanning Line Drive Circuit)

Figure 12:
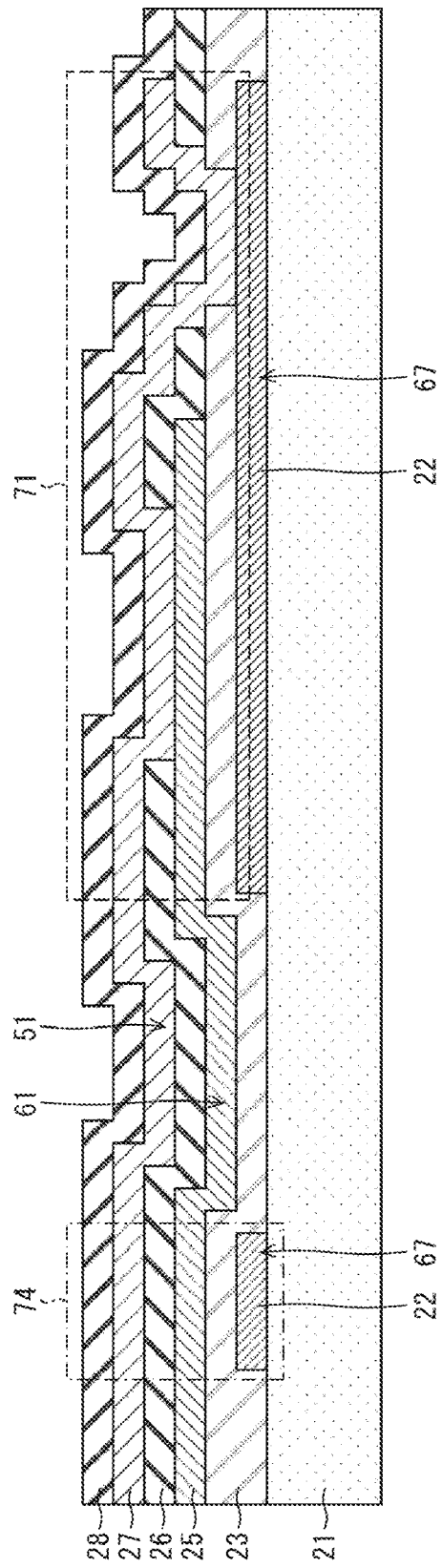
FIG. 12 is a sectional view taken along a line B-B of FIG. 5.

FIG. 12 is a sectional view taken along a line B-B of FIG. 5 and a sectional view illustrating a schematic configuration of the crossing portion 74 and the reconnection portion 71. In the crossing portion 74 illustrated in FIG. 12, the second relay wire 67 that connects the unit circuits on the (n−2)th stage and the (n+2)th stage crosses the first branch wire 61. Further, the reconnection portion 71 illustrated in FIG. 12 connects the first branch wire 61 to the second relay wire 67, which connects the unit circuits on the (n−4)th stage and the nth stage, and the first redundant wire 51.

As illustrated in FIG. 12, in the crossing portion 74, the second relay wire 67 formed by the gate layer 22 crosses the first branch wire 61 formed by the source layer 25 and the first redundant wire 51 formed by the redundant wire layer 27. In the configuration illustrated in FIG. 12, the second relay wire 67 is not held between the first branch wire 61 and the first redundant wire 51. Thus, compared to a configuration in which the second relay wire 67 is held therebetween, wiring capacity between the second relay wire 67, and the first branch wire 61 and the first redundant wire 51 is reduced. Further, any of the clock signals CK1 to CK4 transmitted by the first branch wire 61 is the same as any of the clock signals CK1 to CK4 transmitted by the first redundant wire 51. Thus, the wiring capacity between the first branch wire 61 and the first redundant wire 51 is not a problem.

Accordingly, layering the gate layer 22, the source layer 25, and the redundant wire layer 27 on the insulting substrate 21 in this order as in FIG. 12 reduces wiring capacity of the first relay wire 66 and the second relay wire 67 in the crossing portion 74, and is thus preferable. The reduction of the wiring capacity reduces a signal rounding in the first relay wire 66, the second relay wire 67, and the initialization wire 68 that cross corresponding wires, and is thus preferable. Further, the reduction of the wiring capacity also reduces a signal rounding in the first branch wire 61, the second branch wire 62, the fourth branch wire 64, and the fifth branch wire 65 that are crossed with corresponding wires, and is thus preferable.

As illustrated in FIG. 12, the reconnection portion 71 by which the first branch wire 61 is connected to the second relay wire 67 is formed to be integrated with the first redundant wire 51. Thus, the reconnection portion 71 is also the connection portion 57 of the first redundant wire 51. The first redundant wire 51 is connected to the first branch wire 61 and the second relay wire 67 thorough the contact hole 29. Thus, both of the reconnection portion 71 and the connection portion 57 of the first redundant wire 51 need to be sufficiently larger than the contact hole 29. Accordingly, compared to a configuration in which the first redundant wire 51 includes the connection portion 57 separately from the reconnection portion 71, the configuration in which the reconnection portion 71 is integrated with the first redundant wire 51 makes it easy to reduce an area occupied by the first redundant wire 51.

As illustrated in FIG. 12, in a region where the scanning line drive circuit 47 is formed, a top layer of the layered structure that is layered on the insulating substrate 21 is the second interlayer insulating film 28. In this manner, it is preferable that the top layer is the insulating film because this makes it easy to form the seal 11 (refer to FIG. 13) on the scanning line drive circuit 47. In a configuration in which the top layer is a conductive layer, the conductive layer is easily broken by a spacer included in a seal material. Moreover, in a case where a liquid crystal display device of a TN (twisted nematic) system or a VA (vertical aligned) system uses a spacer in which conductive particles are mixed to achieve conductivity with a counter electrode provided on a counter substrate, short-circuit is easily caused by the conductive particles. On the other hand, in the configuration in which the top layer is the insulating film, breakage or short-circuit of the conductive layer is hardly caused.

For a similar reason, it is also preferable that a top layer of the layered structure that is layered on the insulating substrate 21 is an insulating film in the peripheral region 40. Note that, since the seal 11 is not formed in the display region 30, the top layer of the display region 30 may be a transparent conductive layer in which a pixel electrode is formed, or the like.

(Display Panel)

Figure 13:
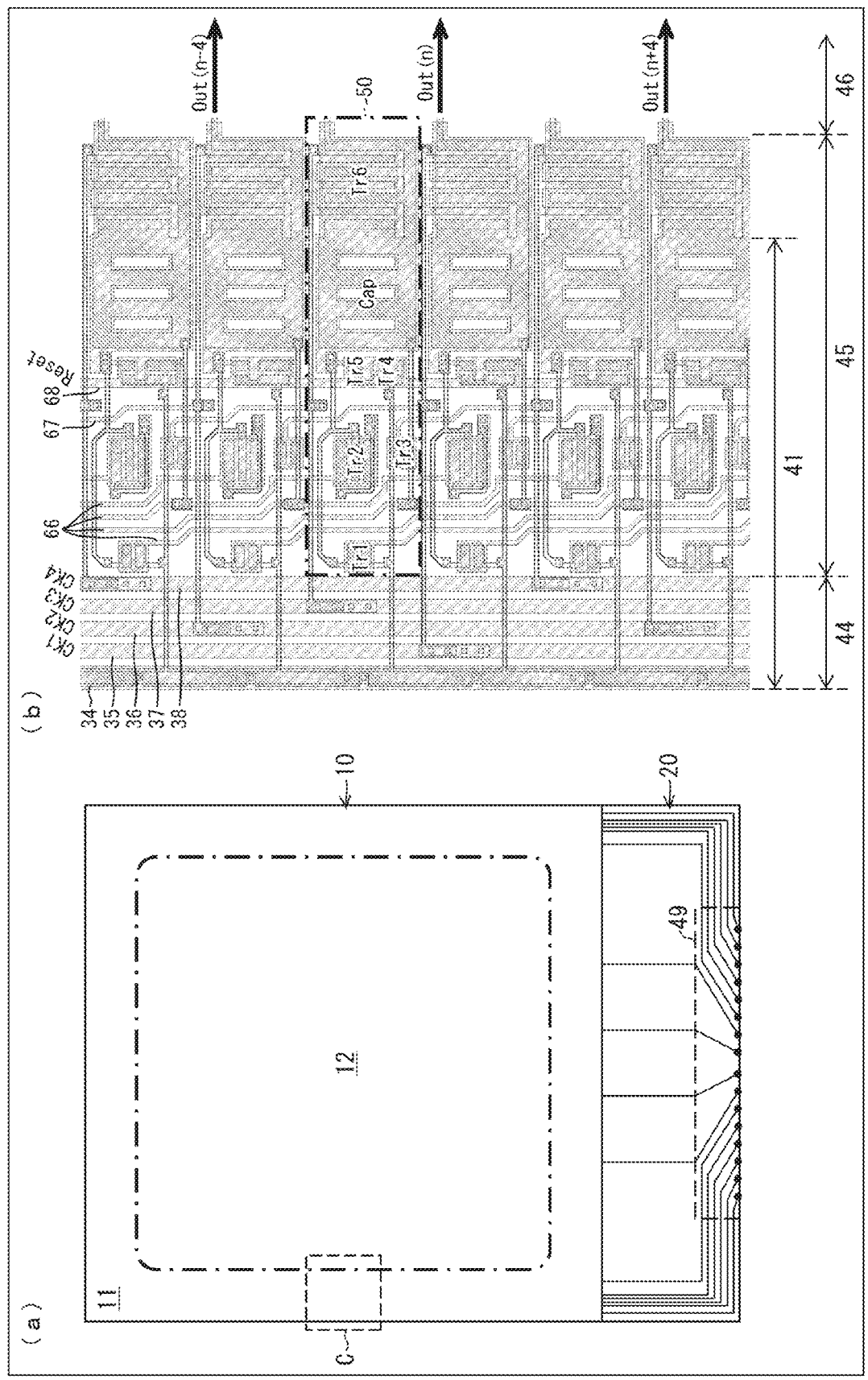
FIG. 13 is a plan view illustrating a schematic configuration of a liquid crystal display panel using the matrix substrate illustrated in FIG. 1.

FIG. 13 is a plan view illustrating a schematic configuration of a liquid crystal display panel 100 (display device) using the matrix substrate 20 illustrated in FIG. 1. FIG. 13(a) is a perspective plan view of the liquid crystal display panel 100. FIG. 13(b) is an enlarged view of a surrounded part C of FIG. 13(a) in the matrix substrate 20.

As illustrated in FIG. 13(a), the liquid crystal display panel 100 includes the matrix substrate 20, a counter substrate 10 facing the matrix substrate, liquid crystal 12 (electrooptical substance) enclosed between the counter substrate 10 and the matrix substrate 20, and the seal 11 by which the liquid crystal 12 is enclosed.

The seal 11 is formed in a seal region 41, which is included in the peripheral region 40, so as to extend along an outer periphery of the counter substrate 10 and enable the terminal portion 49 of the matrix substrate 20 to be connected to outside. As the seal material forming the seal 11, photosetting resin is normally used. Thus, in the seal region 41 where the seal 11 is formed, a light transmission portion through which light that cures the seal material is able to be transmitted is provided in the matrix substrate 20. Further, a spacer that keeps an interval between the counter substrate 10 and the matrix substrate 20 is normally mixed in the seal material.

As illustrated in FIG. 13(b), the seal region 41 is overlapped with (i) a trunk wire region 44 where the low-potential trunk wire 34 and the clock trunk wires 35 to 38 are arranged and (ii) a drive circuit region 45 where the scanning line drive circuit 47 is arranged. Compared to a configuration in which the seal region 41 is not overlapped with the trunk wire region 44 or the drive circuit region 45, such an overlapping configuration makes it possible to reduce an area of the peripheral region 40, and is thus preferable. Further, a rate with which the seal region 41 is overlapped with the drive circuit region 45 is preferably high to reduce the area of the peripheral region 40. However, the sixth transistor Tr6 has a large area and is difficult to be provided with an opening serving as a transmission portion. Thus, the sixth transistor Tr6 is provided to be closer to the display region 30 so that the seal region 41 is not overlapped with the sixth transistor Tr6. Accordingly, the first branch wire 61 by which the source electrode of the sixth transistor Tr6 is connected to any one of the clock trunk wires 35 to 38 is longest and is most easily disconnected among the branch wires 61 to 65.

According to a conventional configuration not including the redundant wires 51 to 55, when the branch wires 61 to 65 are disconnected, the scanning line drive circuit 47 becomes defective. Thus, a defect rate of the scanning line drive circuit 47 is high and it is difficult to improve a production yield of the matrix substrate 20. On the other hand, in the configuration including the redundant wires 51 to 55 according to the present embodiment, since the branch wires 61 to 65 are substantially branched by the corresponding redundant wires 51 to 55, when both the branch wires 61 to 65 and the corresponding redundant wires 51 to 55 are disconnected, the scanning line drive circuit 47 becomes defective. Thus, probability that both of them are disconnected is lower than probability that only one of them is disconnected, so that it is possible to reduce the defect rate of the scanning line drive circuit 47 and improve the production yield of the matrix substrate 20.

(Effect)

According to the aforementioned configuration, the branch wires 61 to 65 are able to be branched by using the corresponding redundant wires 51 to 55. Thus, for example, even when the second branch wire 62 is disconnected, the drain electrodes of the first transistor Tr1, the second transistor Tr2, and the fifth transistor Tr5 are connected to the one electrode of the bootstrap capacitor Cap by the second redundant wire 52. In this manner, by the branching, each of the unit circuits 50 has redundancy for disconnection of the branch wires 61 to 65, thus making it possible to reduce a defect of the unit circuit 50 caused by disconnection of the branch wires 61 to 65. As a result, it is possible to improve production yields of the scanning line drive circuit 47 and the matrix substrate 20.

Note that, though all the branch wires 61 to 65 are able to be branched in the present embodiment, branching of only a part of the branch wires 61 to 65 may be allowed. In such a case, it is preferable that at least the first branch wire 61 is able to be branched. This is because the sixth transistor Tr6 which is the output transistor is normally arranged on a display region side of the drive circuit region 45, so that the first branch wire 61 is longest and is most easily disconnected among the branch wires 61 to 65.

EXAMPLE

The configuration according to Embodiment 1 of the invention is applicable to a small-to-medium sized display device having enhanced definition and is useful.

For example, the configuration according to Embodiment 1 of the invention is applied to an active matrix substrate for a 4.4-inch FHD (full high vision display) with a pixel pitch of 17 μm×51 μm. In such an example, an interval between data lines 32 is 17 μm, an interval between scanning lines 31 is 51 μm, the interval of the data lines 32 (in a case of display of three colors of RGB) is 1080×3=3240, and the number of scanning lines 31 is 1920. Further, a width of unit circuit 50 is 100 μm which is smaller than 51 μm×2=102 μm. An excess space where no unit circuit 50 is arranged is provided for every unit circuits 50 of 20 to 30 stages in the scanning line drive circuit 47 and a by-pass wire or the like for a common electrode is arranged in the excess space.

Further, in order to secure a light transmission portion, through which light that cures a seal material is able to be transmitted, in the scanning line drive circuit 47, the unit circuit 50 has the branch wires 61 to 65 formed with a width of 4 μm and the redundant wires 51 to 55 formed with a width of 3 μm. To reduce the area of the peripheral region 40, the seal 11 is formed so that the scanning line drive circuit 47 is overlapped with the seal region 41, specifically, so that the scanning line drive circuit 47 is completely overlapped with the seal region 41 except for the sixth transistor Tr6.

Embodiment 2

Another embodiment of the invention will be described as follows with reference to FIGS. 14 and 15. Note that, for convenience of description, members having the same functions as those of the members described in the aforementioned embodiment will be given the same reference signs and description thereof will be omitted.

Figure 14:
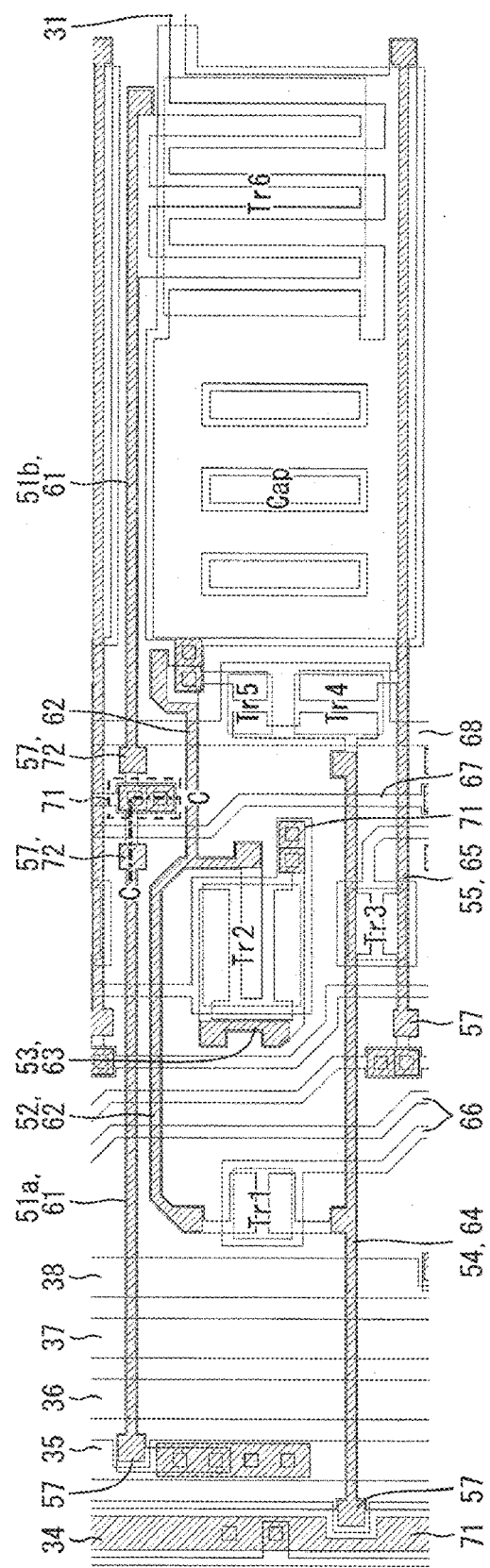
FIG. 14 is a plan view schematically illustrating circuit arrangement of a unit circuit according to another embodiment of the invention.

The matrix substrate 20 according to Embodiment 2 is partially different from the matrix substrate 20 according to Embodiment 1 in circuit arrangement of the unit circuit 50 as illustrated in FIG. 14, but is the same as the matrix substrate 20 according to Embodiment 1 in other configurations. Note that, the circuit configuration of the unit circuit 50 according to Embodiment 2 is the same as the configuration of the unit circuit 50 according to Embodiment 1 illustrated in FIG. 3.

FIG. 14 is a plan view schematically illustrating circuit arrangement of the unit circuit 50 according to Embodiment 2.

As illustrated in FIG. 14, the reconnection portions 71 in the unit circuit 50 according to Embodiment 2 are separated from redundant wires 51a, 51b, and 52 to 55. Thereby, the first redundant wire 51 in Embodiment 1 is divided into a first left redundant wire 51a on a left side of FIG. 14 and a first right redundant wire 51b on a right side of FIG. 14. Further, the branch wires 61 to 65 include connection portions 72 for connection to the reconnection portions 71 and connection portions 72 for connection to the redundant wires 51a, 51b, and 52 to 55. Each of the redundant wires 51a, 51b, and 52 to 55 includes a plurality of connection portions 57 that allow connection to the connection portions 72 of the corresponding branch wires 61 to 65.

Further, in the unit circuit 50 according to Embodiment 2, the redundant wires 51a, 51b, and 52 to 55 are not connected to the corresponding branch wires 61 to 65 in advance. Thus, in a state illustrated in FIG. 14, the branch wires 61 to 65 are able to be branched by the redundant wires 51a, 51b, and 52 to 55, but are not branched yet. In other words, in the state illustrated in FIG. 14, the redundant wires 51a, 51b, and 52 to 55 are floating wires.

Further, in the unit circuit 50 on the nth stage, the second relay wire 67 that connects the unit circuits 50 on the (n−2)th stage and the (n+2)th stage passes between (i) a right end of the first left redundant wire 51a in FIG. 14 and (ii) the reconnection portion 71 by which the first branch wire 61 is connected to the second relay wire 67 that connects the unit circuits 50 on the (n−4)th stage and the nth stage.

Figure 15:
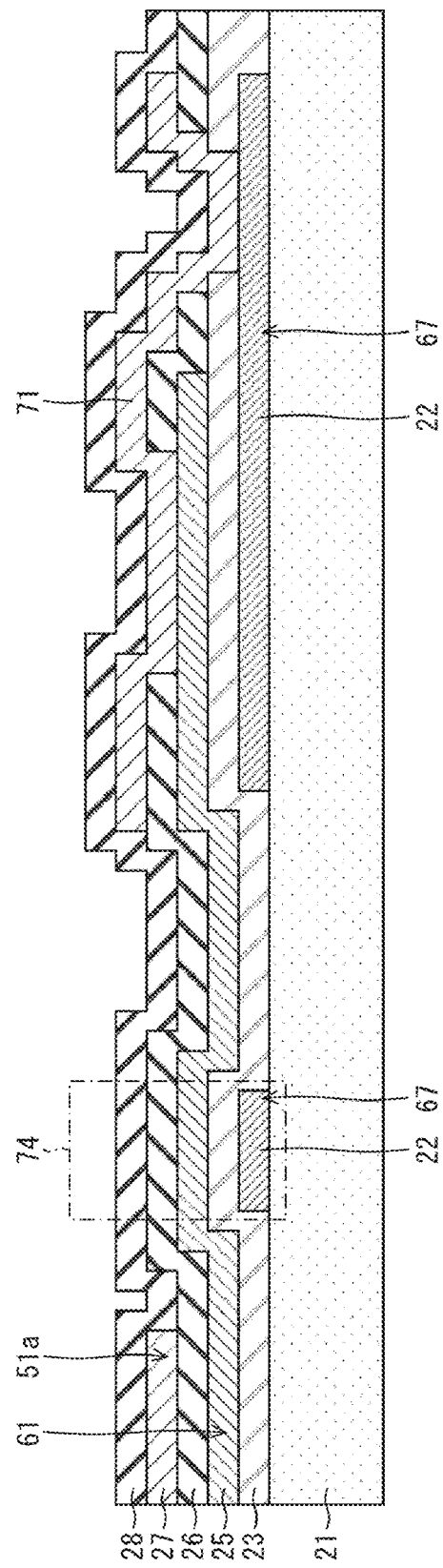
FIG. 15 is a sectional view taken along a line C-C of FIG. 14.

FIG. 15 is a sectional view taken along a line C-C of FIG. 14 and a sectional view illustrating a schematic configuration of the crossing portion 74 and the reconnection portion 71.

As illustrated in FIG. 15, the first left redundant wire 51a is separated from the reconnection portion 71. Moreover, the connection portion 72 of the first branch wire 61 is not connected to the connection portion 57 of the first left redundant wire 51a.

(Branching)

As indicated by FIGS. 14 and 15, the connection portions 57 of the redundant wires 51a, 51b, and 52 to 55 are arranged so as to be overlapped with the corresponding connection portions 72 of the corresponding branch wires 61 to 65. Thus, the connection portion 57 and the connection portion 72 that correspond to each other are able to be connected by melting. Thus, for example, in a case where any of the branch wires 61 to 65 is disconnected, when a plurality of connection portions 57 and a plurality of connection portions 72 that correspond to each other are connected by melting, the branch wires 61 to 65 are able to be connected to the corresponding redundant wires 51, 51b, and 52 to 55, thus making it possible to prevent a defect. Specifically, by radiating laser light selectively to positions where the connection portion 57 and the connection portion 72 that are selected exist, the source layer 25, the first interlayer insulating film 26, and the redundant wire layer 27 are selectively melted. By the melting, a hole is formed in the first interlayer insulating film 26 and the source layer 25 and the redundant wire layer 27 are bonded.

In the connection by melting, the laser light may be radiated from an upper surface side or a lower surface side of the insulating substrate 21. Further, a light shielding film is arranged in the counter substrate 10 in many cases, so that in a case where the connection by melting is performed after the counter substrate 10 is bonded to the matrix substrate 20 by the seal 11, the laser light is preferably radiated from the lower surface side of the insulating substrate 21 to prevent the laser light from being shielded.

Note that, the connection of the connection portion 57 and the connection portion 72 that correspond to each other may be performed before or after the counter substrate 10 is bonded to the matrix substrate 20 by the seal 11. In order to facilitate the connection by melting, it is preferable that the number of layers of the insulating film between the redundant wire layer 27 and the source layer 25 is small and it is more preferable that only the second interlayer insulating film 28 is held between the redundant wire layer 27 and the source layer 25.

Further, in order to prevent the laser light to be radiated from being shielded by the gate layer 22, the connection portions 72 of the branch wires 61 to 65 for connection to the redundant wires 51a, 51b, and 52 to 55 are preferably at positions other than (i) the crossing portion 74 where the branch wires 61 to 65 cross the first relay wire 66, the second relay wire 67, or the initialization wire 68 and (ii) positions where the branch wires 61 to 65 are overlapped with the gate electrodes of the transistors Tr1 to Tr6.

(Effect)

In the unit circuit 50 according to Embodiment 1, the reconnection portion 71 provided in the first redundant wire 51 at the center is proximate to the second redundant wire 52 with reference to FIG. 11, and short-circuit is thus easily caused. Similarly, the reconnection portion 71 provided, at the left end, in the fifth redundant wire 55 of the unit circuit 50 on the nth stage is proximate to the first redundant wire 51 of the adjacent unit circuit 50 on the (n+2)th stage, and short-circuit is thus easily caused. Further, the redundant wires 51 to 55 are connected to the corresponding branch wires 61 to 65 and the reconnection portions 71 are included in the redundant wires 51 to 55.

Thus, in the unit circuit 50 according to Embodiment 1, when the reconnection portion 71 provided in the first redundant wire 51 at the center is short-circuited to the second redundant wire 52, the first branch wire is short-circuited to the second branch wire. Similarly, when the reconnection portion 71 included, at the left end, in the fifth redundant wire 55 of the unit circuit 50 on the nth stage is short-circuited to the first redundant wire 51 of the adjacent unit circuit 50 on the (n+2)th stage, the fifth branch wire 65 of the unit circuit 50 on the nth stage is short-circuited to the first branch wire 61 of the unit circuit 50 on the (n+2)th stage.

On the other hand, in the unit circuit 50 according to Embodiment 2, as illustrated in FIG. 14, the redundant wires 51*a*, 51*b*, and 52 to 55 are arranged separately from the reconnection portions 71 and are floating wires. Thus, even when a reconnection portion 71 is short-circuited to another redundant wire (that does not correspond to the branch wires 61 to 65 connected by the reconnection portion 71), unless the short-circuited redundant wire is connected to a branch wire, branch wires are not short-circuited. Thus, it is possible to reduce a defect of the unit circuit 50 caused by short-circuit between the redundant wires 51 to 55 and the reconnection portion 71.

When any of the branch wires 61 to 65 is disconnected, connection by melting to corresponding any of the redundant wires 51*a*, 51*b*, and 52 to 55 is allowed, so that it is possible to prevent a defect.

Thus, with the configuration according to Embodiment 2, similarly to the configuration according to Embodiment 1, since the branch wires 61 to 65 are able to be branched, the unit circuit 50 has redundancy for disconnection of the branch wires 61 to 65. Further, with the configuration according to Embodiment 2, the unit circuit 50 also has redundancy for the short-circuit of the reconnection portion 71 and another redundant wire. This makes it possible to further improve the production yields of the scanning line drive circuit 47 and the matrix substrate 20.

In addition, the configuration according to Embodiment 1 and the configuration according to Embodiment 2 may be combined. By appropriately combining the configurations, it is possible to improve both efficiency of producing the scanning line drive circuit 47 (production yield at a stage without an operation related to connection by melting) and a final production yield after performing connection by melting to prevent a defect. How to combine the configurations is preferably determined by considering, for example, arrangement of the reconnection portions 71 and the redundant wires 51 to 55.

Embodiment 3

Another embodiment of the invention will be described as follows with reference to FIGS. 16 and 17. Note that, for convenience of description, members having the same functions as those of the members described in the aforementioned embodiments will be given the same reference signs and description thereof will be omitted.

Figure 16:
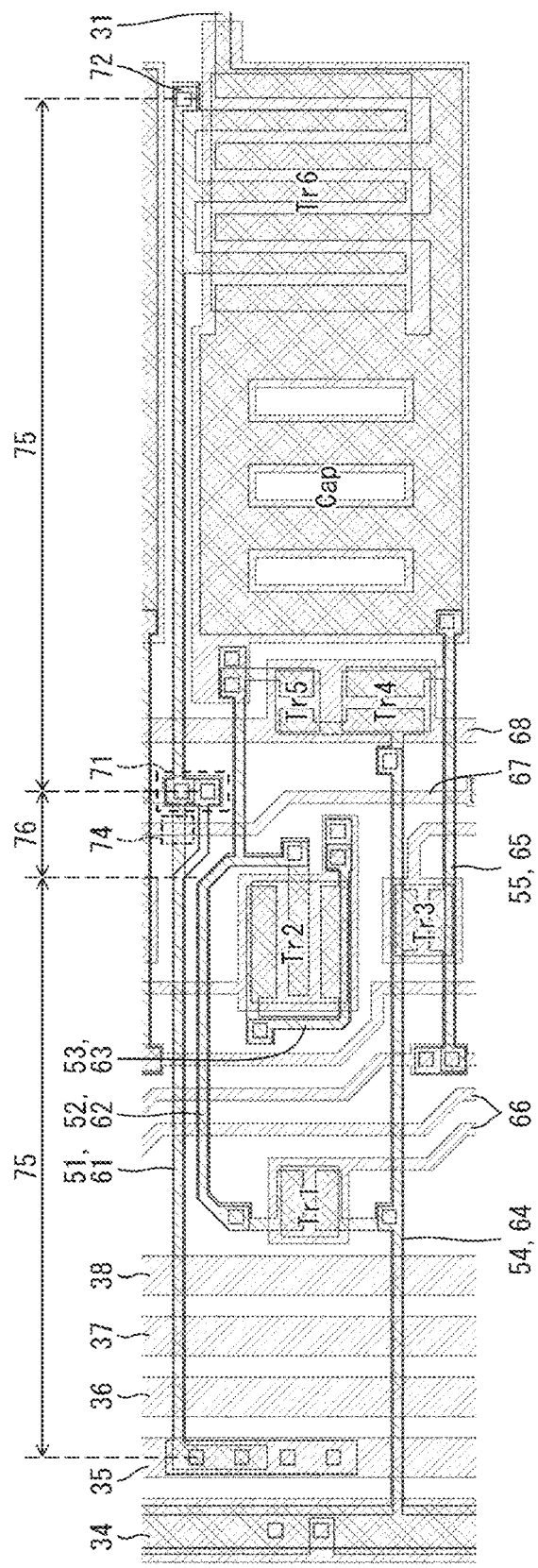
FIG. 16 is a plan view schematically illustrating circuit arrangement of a unit circuit according to still another embodiment of the invention.

The matrix substrate 20 according to Embodiment 3 is partially different from the matrix substrate 20 according to Embodiment 1 in circuit arrangement of the unit circuit 50 as illustrated in FIG. 16, but is the same as the matrix substrate 20 according to Embodiment 1 in other configurations. Note that, the circuit configuration of the unit circuit 50 according to Embodiment 3 is the same as the configuration of the unit circuit 50 according to Embodiment 1 illustrated in FIG. 3.

FIG. 16 is a plan view schematically illustrating circuit arrangement of the unit circuit 50 according to Embodiment 3.

As illustrated in FIG. 16, the first redundant wire 51 in the unit circuit 50 on the nth stage according to Embodiment 3 circumvents the crossing portion 74 where the first branch wire 61 in the unit circuit 50 on the nth stage crosses the second relay wire 67 that connects the unit circuits 50 on the (n−2)th stage and the (n+2)th stage.

By such circumvention, the first redundant wire 51 according to Embodiment 3 has an overlapping section 75 where the first redundant wire 51 is overlapped with the corresponding first branch wire 61 and a circumvention section 76 where the first redundant wire 51 circumvents the crossing portion 74. Though only the first redundant wire 51 has one circumvention section 76 in FIG. 16, there is no limitation thereto. The other redundant wires 52 to 55 may have the circumvention section 76 and the redundant wires 51 to 55 may have two or more circumvention sections 76.

(Cutting)

Figure 17:
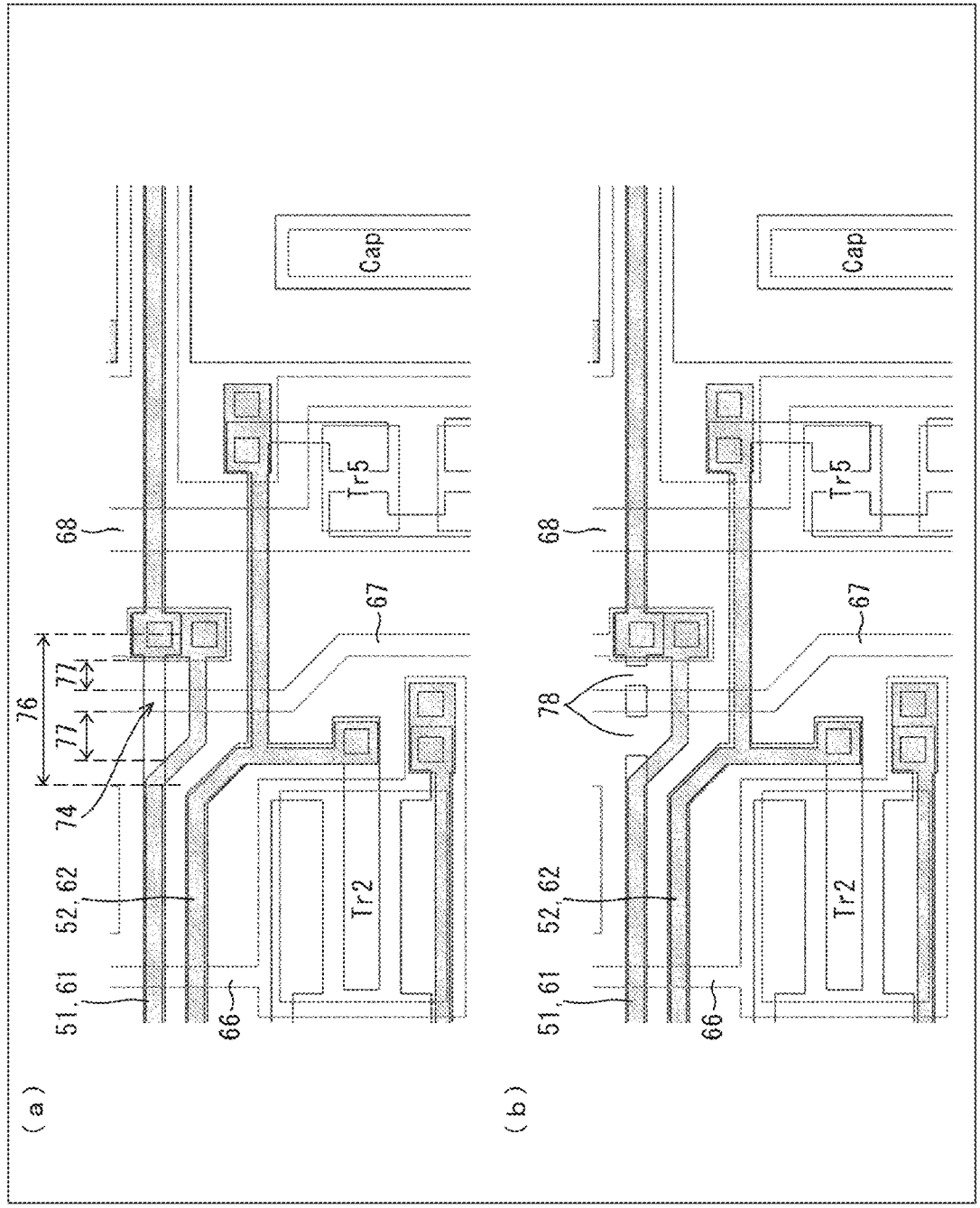
FIG. 17 is an enlarged view of a circumvention section illustrated in FIG. 16, in which (a) is a view before cutting and (b) is a view after cutting.

FIG. 17 is an enlarged view of a vicinity of the circumvention section 76 illustrated in FIG. 16, in which (a) is a view before cutting and (b) is a view after cutting.

In the crossing portion 74, the branch wires 61 to 65 cross the first relay wire 66, the second relay wire 67, or the initialization wire 68. Thus, in the crossing portion 74, the branch wires 61 to 65 may be short-circuited to the first relay wire 66, the second relay wire 67, or the initialization wire 68. When the short-circuit is caused, by separating the crossing portion 74 where the short-circuit is caused from the branch wires 61 to 65, the short-circuit between the branch wires 61 to 65 and the first relay wire 66, the second relay wire 67, or the initialization wire 68 is able to be resolved.

As illustrated in FIG. 17(*a*), the first redundant wire 51 is not overlapped with the first branch wire 61 in the circumvention section 76. Further, there is no wire or electrode overlapped with the first branch wire 61 in cutting sections 77 on both sides of the crossing portion 74. Thus, by cutting only the first branch wire 61 through laser radiation or the like, the first branch wire 61 is able to be separated from the crossing portion 74 as illustrated in FIG. 17(*b*).

In the unit circuit 50 according to Embodiment 3, by separating the first branch wire 61 from the crossing portion 74 as illustrated in FIG. 17(*b*), the short-circuit between the first branch wire 61 and the second relay wire 67 is able to be resolved. Note that, the first branch wire 61 that is cut is branched by the first redundant wire 51 in advance and thus remains capable of supplying a clock signal to (i) the source electrode of the sixth transistor Tr6 and (ii) the second relay wire 67. Thus, it is possible to reduce a defect of the unit circuit 50 caused by the short-circuit of the branch wires 61 to 65 in the crossing portion.

A length of the cutting sections 77 is preferably secured by considering patterning accuracy (a line width and a positional shift in the patterns illustrated in FIGS. 7 to 11) of the wires (the branch wires 61 to 65, the redundant wires 51 to 55, the first relay wire 66, the second relay wire 67, and the initialization wire 68), alignment accuracy of a radiation position of laser radiation for cutting, operation ease of a cutting operation, dispersion of a conductive material in a cutting portion 78 and a vicinity thereof, a length of the cutting portion 78, and the like.

For example, it is preferable to ensure an allowance of 1 to 3 μm for each of the patterning accuracy, the alignment accuracy, the operation ease, the dispersion, and the like. Thus, the length of the cutting sections 77 is preferably 5 μm or more.
(Effect)

With the configuration according to Embodiment 3, similarly to the configuration according to Embodiment 1, since the branch wires 61 to 65 are branched, the unit circuit 50 has redundancy for disconnection of the branch wires 61 to 65. Further, with the configuration according to Embodiment 3, it is possible to resolve the short-circuit of the branch wires 61 to 65 in the crossing portion 74. This makes it possible to further improve the production yields of the scanning line drive circuit 47 and the matrix substrate 20.

In addition, the configurations according to Embodiments 1 to 3 may be combined. By appropriately combining the configurations, it is possible to improve both efficiency of producing the scanning line drive circuit 47 (production yield at a stage without an operation related to connection by melting or related to cutting) and a final production yield after performing connection by melting or performing cutting to prevent a defect. How to combine the configurations is preferably determined by considering, for example, wiring capacity, probability that redundant wires are short-circuited, securing of the light transmission portion through which light for curing the seal material is able to be transmitted, and the like in addition to arrangement of the reconnection portions 71 and the redundant wires 51 to 55.

[Conclusion]

A drive circuit (scanning line drive circuit 47) according to an aspect 1 of the invention includes: a plurality of unit circuits (50) that drive a plurality of output lines (scanning lines 31) and a first-type wire (first relay wire 66, second relay wire 67, initialization wire 68) that connects the unit circuits and is formed by a first conductive layer (gate layer 22), in which at least one of the unit circuits includes a plurality of circuit elements (transistors Tr1 to Tr6, bootstrap capacitor Cap), a second-type wire (branch wires 61 to 65) that connects a circuit element included in the unit circuit to any of (i) another circuit element included in the unit circuit, (ii) the first-type wire, and (iii) a trunk wire which supplies an input, and that is formed by a second conductive layer (source layer 25), and a third-type wire (redundant wires 51 to 55, first left redundant wire 51*a*, first right redundant wire 51*b*) that corresponds at least partially to at least one second-type wire and that is formed by a third conductive layer (redundant wire layer 27), the at least one second-type wire includes a plurality of first-type connection portions (connection portions 72 of branch wire), and the third-type wire includes a plurality of second-type connection portions (connection portions 57 of redundant wire) that allow connection to the respective first-type connection portions of a corresponding second-type wire.

According to the aforementioned configuration, in the at least one unit circuit, the second-type wire that has the third-type wire corresponding thereto includes a plurality of first-type connection portions and the third-type wire includes a plurality of second-type connection portions that allow connection to each of the first-type connection portions of the corresponding second-type wire. Thus, the second-type wire and the third-type wire that correspond to each other are able to be connected by connecting a first connection portion and a second connection portion. Through such connection of the second-type wire and the third-type wire, the first-type connection portions are able to be connected not only by the second-type wire but also by the third-type wire. In other words, it is possible to branch the wires. Thereby, the at least one unit circuit has redundancy for disconnection of the second-type wire, so that the drive circuit has redundancy for disconnection of the second-type wire.

In addition, probability that both of two wires are disconnected is lower than probability that one wire is disconnected. Thus, the branching makes it possible to reduce probability that all the wires that connect the first-type connection portions are disconnected. This makes it possible to reduce a defect of the drive circuit caused by disconnection, thus making it possible to improve a production yield of the drive circuit.

Note that, the first-type connection portions and the second-type connection portions may be connected (i) so that only the first-type connection portions in which the second-type wire connecting the first-type connection portions is disconnected are connected by the third-type wire or (ii) regardless of disconnection of the second-type wire.

Further, combined wiring resistance between the first-type connection portions connected by both of the second-type wire and the third-type wire is smaller than wiring resistance between the first-type connection portions connected only by the second-type wire. Thus, the wiring resistance is able to be reduced by connecting the first-type connection portions and the second-type connection portions that correspond to each other so that the first-type connection portions in which the second-type wire connecting the first-type connection portions is not disconnected are also connected by the third-type wire.

The drive circuit (scanning line drive circuit 47) according to an aspect 2 of the invention may have a configuration in which the at least one of the unit circuits (50) includes, as the circuit element (transistors Tr1 to Tr6, bootstrap capacitor Cap), an output transistor (sixth transistor Tr6) that drives a corresponding output line (scanning line 31), and the output transistor is configured so that one (drain electrode) of a source electrode and a drain electrode is connected to the corresponding output line, and the other (source electrode) of the source electrode and the drain electrode is connected to the trunk wire (any of clock trunk wires 35 to 38) by the second-type wire (first branch wire 61) that has the third-type wire (first redundant wire 51) corresponding thereto, in the aspect 1.

According to the aforementioned configuration, at least the second-type wire by which the output transistor is connected to the trunk wire is able to be branched.

The output transistor drives the output line, and thus preferably has small channel resistance when a state between a source and a drain is conductive. As the channel resistance is small, current flowing between the source and the drain increases and a voltage drop between the source and the drain is reduced. Thus, as the channel resistance of the output transistor is small, the drive circuit is resistant to the output resistance and a rounding of an output signal is able to be reduced. For example, in a case where the drive circuit drives a scanning line of a matrix substrate as the output line, the output transistor preferably has small channel resistance in order to achieve sufficiently high capability of being charged to the scanning line. In this manner, to reduce the channel resistance, the output transistor tends to be larger than the circuit element other than the output transistor.

In addition, the conductive layer forming the circuit element and the conductive layers forming the first-type wire and the second-type wire are normally common. Thus, the circuit element is not able to be overlapped or in contact with the wires. Thus, conventionally, the output transistor has a large area and is not overlapped or in contact with the wires in plan view. Additionally, a photosetting material is often used for a seal material forming a seal by which an electrooptical substance such as liquid crystal is enclosed. Thus, a transmission portion by which light that cures the seal material is able to be transmitted is provided in a region where the seal is formed.

Accordingly, in general, the drive circuit and the trunk wire are laid out so that, in a peripheral region of a matrix substrate for a display device, (i) the output transistor is arranged on a display region side, (ii) the trunk wire is arranged opposite to the display region, and (iii) the circuit element other than the output transistor included in the unit circuit is arranged between the output transistor and the trunk wire.

In such a layout, the second-type wire by which the output transistor is connected to the trunk wire is longest among second-type wires. Thus, the second-type wire by which the output transistor is connected to the trunk wire is most likely to be disconnected and also most likely to have largest wiring resistance. For such reasons, it is very useful that the second-type wire by which the output transistor is connected to the trunk wire is able to be branched.

The drive circuit (scanning line drive circuit 47) according to an aspect 3 of the invention may have a configuration in which the other (source electrode of sixth transistor Tr6) of the source electrode and the drain electrode of the output transistor is connected to the trunk wire (any of clock trunk wires 35 to 38) that supplies a clock signal to the drive circuit, in the aspect 2.

The drive circuit (scanning line drive circuit 47) according to an aspect 4 of the invention may have a configuration in which the first conductive layer (gate layer 22), the second conductive layer (source layer 25), and the third conductive layer (redundant wire layer 27) are conductive layers different from each other, in any one aspect of the aspects 1 to 3.

According to the aforementioned configuration, since the first conductive layer, the second conductive layer, and the third conductive layer are conductive layers different from each other, the first-type wire, the second-type wire, and the third-type wire are able to be overlapped with each other in plan view. Thus, the second-type wire may be arranged so that the second-type wire crosses the first-type wire. Moreover, the third-type wire may be arranged so that the third-type wire crosses the first-type wire. Moreover, the third-type wire may be arranged so that the third-type wire extends on the second-type wire along the second-type wire.

The drive circuit (scanning line drive circuit 47) according to an aspect 5 of the invention may have a configuration in which only an insulating film (first interlayer insulating film 26) is held between the second conductive layer (source layer 25) and the third conductive layer (redundant wire layer 27), in the aspect 4.

According to the aforementioned configuration, only the insulating film is held between the second conductive layer and the third conductive layer. Thus, it is possible to reduce wiring capacity between (i) the second-type wire and the third-type wire that correspond to each other and (ii) another wire. Thereby, a capacity load is reduced, thus making it possible to reduce a signal rounding. This is particularly useful when the second-type wire and the third-type wire that correspond to each other are overlapped in plan view.

Further, according to the aforementioned configuration, since the second conductive layer and the third conductive layer are close, the first-type connection portion and the second-type connection portion that correspond to each other are easily connected. Thus, thickness of the insulating film between the second conductive layer and the third conductive layer is preferably thin.

The drive circuit (scanning line drive circuit 47) according to an aspect 6 of the invention may have a configuration in which the second-type wire (branch wires 61 to 65) includes a third-type connection portion (connection portion 72 of branch wire) for connection to any of an electrode of the circuit element (transistors Tr1 to Tr6, bootstrap capacitor Cap), which is formed by the first conductive layer, the first-type wire (first relay wire 66, second relay wire 67, initialization wire 68), and the trunk wire (low-potential trunk wire 34, clock trunk wires 35 to 38) formed by the first conductive layer, and the third-type connection portion includes at least one of the first-type connection portions (connection portion 72 of branch wire), in the aspect 4 or 5.

According to the aforementioned configuration, the third-type connection portion by which the second-type wire is connected to the circuit element, the first-type wire, or the trunk wire includes at least one first-type connection portion. Thus, the number of connection portions (first-type connection portions and third-type connection portions) provided in the second-type wire is able to be reduced.

A connection portion for connection of wires formed by different conductive layers is larger than a part which is not the connection portion. For example, the wires are connected by (i) forming an insulating film on a conductive layer, (ii) forming a through hole in the insulating film, and (iii) forming another conductive layer on the insulating film and filling the through hole with a conductive material. In this case, the connection portion needs to be sufficiently larger than an opening of the through hole.

Thus, reduction of the number of connection portions provided in the second-type wire is useful for reducing an area of a region where the second-type wire is arranged and is useful for reducing an area of a region where the drive circuit is laid out.

The drive circuit (scanning line drive circuit 47) according to an aspect 7 of the invention may have a configuration in which the unit circuit (50) further includes a reconnection portion (71) formed by the third conductive layer (redundant wire layer 27), the second-type wire (branch wires 61 to 65) includes a third-type connection portion (connection portion 72 of branch wire) for connection, through the reconnection portion, to any of an electrode (one electrode of bootstrap capacitor Cap, gate electrode of second transistor Tr2) of the circuit element, which is formed by the first conductive layer, the first-type wire (first relay wire 66, second relay wire 67), and the trunk wire (low-potential trunk wire 34, clock trunk wires 35 to 38) formed by the first conductive layer, and the reconnection portion is separated from the third-type wire (redundant wires 51a, 51b, 52 to 55), in the aspect 4 or 5.

The drive circuit (scanning line drive circuit 47) according to an aspect 8 of the invention may have a configuration in which at least one third-type wire (redundant wires 51a, 51b, 52 to 55) has an overlapping section (overlapping section 75) where the at least one third-type wire is overlapped with a corresponding second-type wire (branch wires 61 to 55) in plan view, in any one aspect of the aspects 4 to 7.

According to the aforementioned configuration, the at least one third-type wire has the overlapping section where the at least one third-type wire is overlapped with the corresponding second-type wire. This makes it possible to reduce wiring capacity between the second-type wire and the third-type wire that correspond to each other, and another wire.

In recent years, a gate driver monolithic (GMD) technique of monolithically forming a scanning line drive circuit in a matrix substrate has become widespread. In a display device using such a matrix substrate, a seal material is cured in a peripheral region of the matrix substrate and a seal by which an electrooptical substance such as liquid crystal is enclosed between the matrix substrate and a counter substrate is formed. The scanning line drive circuit is also used for the peripheral region of the matrix substrate. Thus, to reduce an area of the peripheral region, a part or all of a drive circuit region where the scanning line drive circuit is formed is overlapped with a seal region where the seal is formed. Accordingly, in order to enable use of a photosetting seal material, the scanning line drive circuit preferably has a configuration in which a light transmission portion through which light that cures the seal material is transmitted is easily secured.

According to the aforementioned configuration, the at least one third-type wire has the overlapping section where the at least one third-type wire is overlapped with the corresponding second-type wire. Thus, the light transmission portion is easily secured. Accordingly, it is possible to achieve the drive circuit suitable for the matrix substrate adopting the GMD technique.

The drive circuit (scanning line drive circuit 47) according to an aspect 9 of the invention may have a configuration in which the first conductive layer (gate layer 22), the second conductive layer (source layer 25), and the third conductive layer (redundant wire layer 27) are layered in this order on an insulating substrate (21), in the aspect 8.

The drive circuit (scanning line drive circuit 47) according to an aspect 10 of the invention may have a configuration in which a width of the third-type wire (redundant wires 51 to 55, first left redundant wire 51a, first right redundant wire 51b) is narrower than a width of the corresponding second-type wire (branch wires 61 to 65) in the overlapping section (75), in the aspect 9.

According to the aforementioned configuration, among the third-type wire and the second-type wire that correspond to each other, the second-type wire on the substrate side is thick and the third-type wire opposite to the substrate is thin in the overlapping section. Thus, the wire opposite to the substrate is thin, so that the light transmission portion is easily secured. In the matrix substrate adopting the GMD technique, the scanning line drive circuit preferably has a configuration in which the light transmission portion through which light that cures the seal material is transmitted is easily secured. Accordingly, it is possible to achieve the drive circuit suitable for the matrix substrate adopting the GMD technique.

The drive circuit (scanning line drive circuit 47) according to an aspect 11 of the invention may have a configuration in which the at least one third-type wire (redundant wires 51 to 55, first left redundant wire 51a, first right redundant wire 51b) has a circumvention section (76) where the at least one third-type wire circumvents a crossing portion (74) where a second-type wire (branch wires 61 to 65) corresponding thereto and the first-type wire (first relay wire 66, second relay wire 67, initialization wire 68) cross in plan view, in any one aspect of the aspects 4 to 10.

According to the aforementioned configuration, the at least one third-type wire has the circumvention section where the at least one third-type wire circumvents the crossing portion where the second-type wire crosses the first-type wire. Thus, when short-circuit of the second-type wire and the first-type wire is caused in the circumvented crossing portion, the short-circuit is easily repaired. With the repair, for example, (i) the second-type wire is cut on both sides of the crossing portion where the short-circuit is caused and (ii) the first-type connection portion and the second-type connection portion are connected so that the third-type wire connects first-type connection portions in which the second-type wire which connects the first-type connection portions is disconnected through the cutting. Note that, in order to facilitate the cutting for the repair, it is preferable that a wire or a circuit element is not arranged on the second-type wire on both sides (for example, within 5 µm) of the circumvented crossing portion.

The drive circuit (scanning line drive circuit 47) according to an aspect 12 of the invention may have a configuration in which the circuit element includes a transistor (Tr1 to Tr6) that includes (i) a gate electrode that is formed by the first conductive layer (gate layer 22) and (ii) a source electrode and a drain electrode that are formed by the second conductive layer (source layer 25), in any one aspect of the aspects 1 to 11.

The drive circuit (scanning line drive circuit 47) according to an aspect 13 of the invention may have a configuration in which the first-type wire includes a first relay wire (66) that supplies, to one of the unit circuits, an output of another one of the unit circuits, in any one aspect of the aspects 1 to 12.

According to the aforementioned configuration, the unit circuit is able to supply an output of another unit circuit. Thus, for example, a flip-flop circuit is usable as the unit circuit, so that the drive circuit is able to function as a shift register.

The drive circuit (scanning line drive circuit 47) according to an aspect 14 of the invention may have a configuration in which the first-type wire includes a second relay wire (67) that supplies, to one of the unit circuits, an input of another one of the unit circuits, in any one aspect of the aspects 1 to 13.

According to the aforementioned configuration, the unit circuit is able to supply an input of another unit circuit. Thus, a degree of freedom in connection performed between the trunk wire and the unit circuit to perform an input to the drive circuit is able to be increased. For example, it is possible to branch the relay wire from the branch wire by which the circuit element is connected to the trunk wire and branch the relay wire from an electrode of the circuit element connected to the trunk wire.

The drive circuit (scanning line drive circuit 47) according to an aspect 15 of the invention may have a configuration in which the first-type wire includes an initialization wire (68) that supplies an initialization signal (Reset) for initializing the unit circuit, in any one aspect of the aspects 1 to 14.

A matrix substrate (20) according to an aspect 16 of the invention has a configuration including an insulating substrate (21) that includes a display region (30) where the output lines are arranged as scanning lines (31), and a peripheral region (40) where the drive circuit (scanning line drive circuit 47) according to any one aspect of the aspects 1 to 15 and the trunk wire (low-potential trunk wire 34, clock trunk wires 35 to 38) are arranged.

A matrix substrate (20) according to an aspect 17 of the invention includes an insulating substrate (21) that includes a display region (30) where a plurality of scanning lines (31) are arranged, and a peripheral region (40) where (i) a drive circuit (scanning line drive circuit 47) that includes a plurality of unit circuits (50) that drive the scanning lines and a first-type wire (first relay wire 66, second relay wire 67, initialization wire 68) that connects the unit circuits and is formed by a first conductive layer (gate layer 22) and (ii) a trunk wire (low-potential trunk wire 34, clock trunk wires 35 to 38) that supplies an input (Vss, CK1 to CK4) to the drive circuit are arranged, in which at least one of the unit circuits includes: a plurality of circuit elements (transistors Tr1 to Tr6, bootstrap capacitor Cap); a second-type wire (branch wires 61 to 65) that connects a circuit element included in the unit circuit to any of (i) another circuit element included in the circuit, (ii) the first-type wire, and (iii) the trunk wire, and that is formed by a second conductive layer (source layer 25); and a third-type wire (redundant wires 51 to 55, first left redundant wire 51*a*, first right redundant wire 51*b*) that corresponds at least partially to at least one second-type wire and that is formed by a third conductive layer (redundant wire layer 27), the at least one second-type wire includes a plurality of first-type connection portions (connection portions 72 of branch wire), and the third-type wire includes a plurality of second-type connection portions (connection portions 57 of redundant wire) that allow connection to the respective first-type connection portions of a corresponding second-type wire.

The matrix substrate (20) according to an aspect 18 of the invention may have a configuration in which the peripheral region (40) includes a seal region (41) where a seal (11) by which an electrooptical substance (liquid crystal 12) is enclosed is formed, and in the seal region, a top layer of lamination including the first conductive layer (gate layer 22), the second conductive layer (source layer 25), and the third conductive layer (redundant wire layer 27) that are layered on the insulating substrate (21) is an insulating film (second interlayer insulating film 28), in the aspect 16 or 17.

A display device (liquid crystal display panel 100) according to an aspect 19 of the invention is configured to include the matrix substrate according to any one aspect of the aspects 16 to 18.

The invention is not limited to each of the embodiments described above, and may be modified in various manners within the scope indicated in the claims and an embodiment achieved by appropriately combining technical means disclosed in each of different embodiments is also encompassed in the technical scope of the invention. Further, by combining the technical means disclosed in each of the embodiments, a new technical feature may be formed.

REFERENCE SIGNS LIST 10 counter substrate
11 seal
12 liquid crystal
20 matrix substrate
21 insulating substrate
22 gate layer (first conductive layer)
23 gate insulating film
24 semiconductor layer
25 source layer (second conductive layer)
26 first interlayer insulating film
27 redundant wire layer (third conductive layer)
28 second interlayer insulating film
29 contact hole
30 display region
31 scanning line (output line)
32 data line
34 low-potential trunk wire (trunk wire)
35 first clock trunk wire (trunk wire)
36 second clock trunk wire (trunk wire)
37 third clock trunk wire (trunk wire)
38 fourth clock trunk wire (trunk wire)
40 peripheral region
41 seal region
44 trunk wire region
45 drive circuit region
47 scanning line drive circuit (drive circuit)
48 data line drive circuit
49 terminal portion
50 unit circuit
51 first redundant wire (third-type wire)
51*a* first left redundant wire (third-type wire)
51*b* first right redundant wire (third-type wire)
52 second redundant wire (third-type wire)
53 third redundant wire (third-type wire)
54 fourth redundant wire (third-type wire)
55 fifth redundant wire (third-type wire)
57 connection portion of redundant wire, connection portion (second-type connection portion)
61 first branch wire (second-type wire)
62 second branch wire (second-type wire)
63 third branch wire (second-type wire)
64 fourth branch wire (second-type wire)
65 fifth branch wire (second-type wire)
66 first relay wire (first-type wire)
67 second relay wire (first-type wire)
68 initialization wire (first-type wire)
71 reconnection portion
72 connection portion of branch wire, connection portion (first-type connection portion)
74 crossing portion
75 overlapping section
76 circumvention section
100 liquid crystal display panel
Cap bootstrap capacitor
CK1 first clock signal (input, clock signal)
CK2 second clock signal (input, clock signal)
CK3 third clock signal (input, clock signal)
CK4 fourth clock signal (input, clock signal)
Out output
Reset initialization signal
Tr1 first transistor
Tr2 second transistor
Tr3 third transistor
Tr4 fourth transistor
Tr5 fifth transistor
Tr6 sixth transistor
Vss low potential (input)

The invention claimed is:

1. A drive circuit comprising:
a plurality of unit circuits that drive a plurality of output lines; and
a first-type wire that connects the unit circuits and is defined in a first conductive layer, wherein
at least one of the unit circuits includes:
a plurality of circuit elements,
a second-type wire that connects a circuit element included in the unit circuit to any of (i) another circuit element included in the unit circuit, (ii) the first-type wire, and (iii) a trunk wire which supplies an input, and that is defined in a second conductive layer, and
a third-type wire that corresponds at least partially to at least one second-type wire and that is defined in a third conductive layer,
the second-type wire includes first-type connection portions,
the third-type wire includes second-type connection portions that connect to respective ones of the first-type connection portions of the second-type wire such that a section of the second-type wire between the first-type connection portions is parallel with a section of the third-type wire between the second-type connection portions, the first conductive layer, the second conductive layer, and the third conductive layer are defined by different conductive layers, and the third-type wire includes an overlapping section where the third-type wire is overlapped by the section of the second-type wire between the first-type connection portions in a plan view.

2. The drive circuit according to claim 1, wherein the at least one of the unit circuits includes, as the circuit element, an output transistor that drives a corresponding output line, and the output transistor is configured so that one of a source electrode and a drain electrode is connected to the corresponding output line, and the other of the source electrode and the drain electrode is connected to the trunk wire by the second-type wire that has the third-type wire corresponding thereto.

3. The drive circuit according to claim 2, wherein the other of the source electrode and the drain electrode of the output transistor is connected to the trunk wire that supplies a clock signal to the drive circuit.

4. The drive circuit according to claim 1, wherein only an insulating film is held between the second conductive layer and the third conductive layer.

5. The drive circuit according to claim 1, wherein the second-type wire includes a third-type connection portion to connect to any of an electrode of the circuit element, which is defined by the first conductive layer, the first-type wire, and the trunk wire defined by the first conductive layer, and the third-type connection portion includes at least one of the first-type connection portions.

6. The drive circuit according to claim 1, wherein the unit circuit further includes a reconnection portion defined in the third conductive layer, the second-type wire includes a third-type connection portion to connect, through the reconnection portion, to any of an electrode of the circuit element, which is defined in the first conductive layer, the first-type wire, and the trunk wire defined in the first conductive layer, and the reconnection portion is separated from the third-type wire.

7. The drive circuit according to claim 1, wherein the first conductive layer, the second conductive layer, and the third conductive layer are layered in this order on an insulating substrate.

8. The drive circuit according to claim 7, wherein a width of the third-type wire is narrower than a width of the second-type wire in the overlapping section.

9. The drive circuit according to claim 1, wherein the third-type wire includes a circumvention section where the at least one third-type wire circumvents a crossing portion where the second-type wire and the first-type wire cross in the plan view.

10. The drive circuit according to claim 1, wherein the circuit element includes a transistor that includes (i) a gate electrode that is defined in the first conductive layer and (ii) a source electrode and a drain electrode that are defined in the second conductive layer.

11. A matrix substrate comprising an insulating substrate that includes a display region where the output lines are arranged as scanning lines, and a peripheral region where the drive circuit according to claim 1 and the trunk wire are arranged.

12. The matrix substrate according to claim 11, wherein the peripheral region includes a seal region where a seal by which an electrooptical substance is enclosed is provided, and in the seal region, a top layer of lamination including the first conductive layer, the second conductive layer, and the third conductive layer that are layered on the insulating substrate is an insulating film.

13. A display device comprising the matrix substrate according to claim 11.

14. The drive circuit according to claim 1, wherein the second wire-type includes a wire that connects one or more of the plurality of circuit elements to the trunk wire.

* * * * *